(12) United States Patent
Lu et al.

(10) Patent No.: US 11,915,643 B2
(45) Date of Patent: Feb. 27, 2024

(54) DISPLAY SUBSTRATE AND DRIVE METHOD THEREOF, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Hongting Lu, Beijing (CN); Yuhsiung Feng, Beijing (CN); Xin Mou, Beijing (CN); Chenyu Chen, Beijing (CN); Shuang Zhao, Beijing (CN); Zhongliu Yang, Beijing (CN); Jing Yang, Beijing (CN); Wenbo Chen, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 426 days.

(21) Appl. No.: 17/267,261

(22) PCT Filed: May 6, 2020

(86) PCT No.: PCT/CN2020/088773
§ 371 (c)(1),
(2) Date: Feb. 9, 2021

(87) PCT Pub. No.: WO2021/223101
PCT Pub. Date: Nov. 11, 2021

(65) Prior Publication Data
US 2023/0133179 A1    May 4, 2023

(51) Int. Cl.
*G09G 3/3233*    (2016.01)
*H10K 59/131*    (2023.01)

(52) U.S. Cl.
CPC ....... *G09G 3/3233* (2013.01); *H10K 59/1315* (2023.02); *G09G 2300/0408* (2013.01);
(Continued)

(58) Field of Classification Search
CPC ......... G09G 3/3233; G09G 2300/0408; G09G 2300/0426; G09G 2300/0452;
(Continued)

(56) References Cited

U.S. PATENT DOCUMENTS 10,657,894 B2 *   5/2020   Peng ................... G09G 3/3233
10,902,779 B2     1/2021   Li et al.
(Continued)

FOREIGN PATENT DOCUMENTS

CN    107610652 A    1/2018
CN    108877680 A    11/2018
(Continued)

OTHER PUBLICATIONS

Extended European search report issued by the European Patent Office in the application No. 20900693.1, the EESR dated May 23, 2023.

*Primary Examiner* — Kenneth B Lee, Jr.
(74) *Attorney, Agent, or Firm* — Dilworth & Barrese, LLP.; Michael J. Musella, Esq.

(57) ABSTRACT

A display substrate and a drive method thereof and a display device. The display substrate includes a base substrate and a plurality of sub-pixels on the base substrate, each sub-pixel includes a pixel circuit, and the pixel circuit includes a first reset sub-pixel. The first reset sub-pixel is configured to apply a first reset voltage to a light-emitting element in response to a first reset control voltage to reversely bias the light-emitting element.

18 Claims, 17 Drawing Sheets

(52) U.S. Cl.
CPC .............. *G09G 2300/0426* (2013.01); *G09G 2300/0452* (2013.01); *G09G 2300/0819* (2013.01); *G09G 2300/0842* (2013.01); *G09G 2300/0861* (2013.01); *G09G 2310/0272* (2013.01); *G09G 2310/08* (2013.01); *G09G 2320/043* (2013.01); *G09G 2330/026* (2013.01)

(58) Field of Classification Search
CPC ... G09G 2300/0819; G09G 2300/0842; G09G 2300/0861; G09G 2310/0272; G09G 2310/08; G09G 2320/043; G09G 2330/026; H10K 59/1315
See application file for complete search history.

(56) References Cited

U.S. PATENT DOCUMENTS

| | | | |
|---|---|---|---|
| 10,916,199 | B2 | 2/2021 | Zhu et al. |
| 2020/0074928 | A1 | 3/2020 | Li et al. |
| 2020/0273411 | A1* | 8/2020 | Gao ............... G09G 3/3233 |
| 2021/0166630 | A1* | 6/2021 | Kim ............... G11C 19/28 |
| 2021/0167161 | A1* | 6/2021 | Yang ............... H10K 59/131 |
| 2022/0122522 | A1* | 4/2022 | Li ............... G09G 3/2092 |
| 2022/0383811 | A1* | 12/2022 | Liu ............... H10K 59/131 |

FOREIGN PATENT DOCUMENTS

| | | |
|---|---|---|
| CN | 109215582 A | 1/2019 |
| CN | 109243369 A | 1/2019 |
| CN | 110690265 A | 1/2020 |
| WO | 2019186765 A1 | 10/2019 |

\* cited by examiner

DISPLAY SUBSTRATE AND DRIVE METHOD THEREOF, AND DISPLAY DEVICE

TECHNICAL FIELD

Embodiments of the present disclosure relate to a display substrate and a drive method thereof, and a display device.

BACKGROUND

With the development of OLED (Organic Light-Emitting Diode) display technology, people's demand for display devices with high brightness and long lifetime is increasing. How to improve the service life of OLED display devices is a concern in the related technology field.

SUMMARY

At least an embodiment of the present disclosure provides a display substrate comprising a base substrate and a plurality of sub-pixels which are located on the base substrate and arranged in an array. Each of the plurality of sub-pixels comprises a pixel circuit, and the pixel circuit is configured to drive a light-emitting element corresponding to the each of the plurality of sub-pixels to emit light; each of the plurality of pixel circuits comprises a drive sub-circuit, a data write sub-circuit, a compensation sub-circuit, a storage sub-circuit, and a first reset sub-circuit; the drive sub-circuit comprises a control terminal, a first terminal, and a second terminal, and the drive sub-circuit is configured to be connected with the light-emitting element and control a drive current flowing through the light-emitting element; the data write sub-circuit is connected with the first terminal of the drive sub-circuit and is configured to write a data signal into the first terminal of the drive sub-circuit in response to a first scanning signal; the compensation sub-circuit comprises a control terminal, a first terminal and a second terminal, and the control terminal of the compensation sub-circuit is configured to receive a second scanning signal, the first terminal and the second terminal of the compensation sub-circuit are respectively electrically connected with the control terminal and the second terminal of the drive sub-circuit, and the compensation sub-circuit is configured to compensate a threshold value of the drive sub-circuit in response to the second scanning signal; the storage sub-circuit comprises a first terminal and a second terminal, the first terminal of the storage sub-circuit is configured to receive a first power supply voltage, and the second terminal of the storage sub-circuit is electrically connected with the control terminal of the drive sub-circuit; the first reset sub-circuit comprises a control terminal, a first terminal, and a second terminal, the control terminal of the first reset sub-circuit is configured to receive a first reset control voltage, the first terminal of the first reset sub-circuit is configured to receive a first reset voltage, and the second terminal of the first reset sub-circuit is configured to be connected with the light-emitting element; the first reset sub-circuit is configured to apply the first reset voltage to the light-emitting element to reversely bias the light-emitting element in response to the first reset control voltage; and the plurality of sub-pixels comprise a first sub-pixel, the display substrate further comprises a first reset voltage terminal, and the first reset voltage terminal is configured to be connected with a first terminal of the first reset sub-circuit of the first sub-pixel to provide the first reset voltage to the first sub-pixel.

In some examples, each of the plurality of pixel circuits further comprises a second reset sub-circuit, and the second reset sub-circuit is connected with the control terminal of the drive sub-circuit and is configured to apply a second reset voltage to the control terminal of the drive sub-circuit in response to a second reset control voltage, to reset the control terminal of the drive sub-circuit.

In some examples, the display substrate further comprises a second reset voltage terminal; the second reset voltage terminal is configured to be connected with the second reset sub-circuit to provide the second reset voltage, and the second reset voltage output by the second reset voltage terminal is greater than the first reset voltage output by the first reset voltage terminal.

In some examples, the plurality of sub-pixels are distributed in a plurality of pixel rows and a plurality of pixel columns along a first direction and a second direction, and the display substrate further comprises a first reset voltage line extended along the first direction, and the first reset voltage line is electrically connected with the first reset voltage terminal and the first terminal of the first reset sub-circuit respectively to provide the first reset voltage for the sub-pixel.

In some examples, the display substrate further comprises a first reset signal line extended along the first direction, the first reset signal line is connected with the control terminal of the second reset sub-circuit to provide the second reset voltage, the first reset signal line is at a side of the first reset voltage line close to the base substrate, and the first reset signal line comprises a doped semiconductor material.

In some examples, the display substrate further comprises a second reset signal line extended along the second direction, and the second reset signal line is at a side of the first reset voltage line away from the base substrate and is electrically connected with the first reset signal line.

In some examples, each of the plurality of pixel circuits further comprises a first connection electrode; the first connection electrode is at a side of the first reset voltage line away from the base substrate, and is respectively electrically connected with the first terminal of the first reset sub-circuit and the first reset voltage line.

In some examples, the storage sub-circuit comprises a storage capacitor, and the storage capacitor comprises a first capacitor electrode and a second capacitor electrode; the first capacitor electrode and the first reset voltage line are in a same layer and insulated from each other, and the second capacitor electrode is at a side of the first capacitor electrode close to the base substrate.

In some examples, each of the plurality of pixel circuits further comprises a second connection electrode; the second connection electrode and the first connection electrode are in a same layer and insulated from each other, and the second connection electrode is respectively electrically connected with the second capacitor electrode and the first terminal of the compensation sub-circuit.

In some examples, the first capacitor electrode comprises an opening, and the second connection electrode is insulated from the first capacitor electrode and is electrically connected with the second capacitor electrode through the opening.

In some examples, each of the plurality of pixel circuits further comprises a third connection electrode; the third connection electrode and the first connection electrode are in a same layer and insulated from each other, the third connection electrode comprises a first connection terminal and a second connection terminal, the first connection terminal is electrically connected with the second terminal of the first reset sub-circuit, and the second connection terminal is configured to be connected with the light-emitting element.

In some examples, each of the plurality of pixel circuits further comprises a light emission control sub-circuit; the light emission control sub-circuit comprises a control terminal, a first terminal, and a second terminal, the first terminal of the light emission control sub-circuit is connected with the second terminal of the drive sub-circuit, and the second terminal of the light emission control sub-circuit is configured to be connected with the light-emitting element.

In some examples, the third connection electrode further comprises a third connection terminal, and the third connection terminal is electrically connected with the second terminal of the light emission control sub-circuit, thereby connecting the second terminal of the light emission control sub-circuit with the light-emitting element.

In some examples, the third connection electrode is in a U-shaped structure; the first connection terminal and the second connection terminal are respectively at two end points of the U-shaped structure, and the third connection terminal is at a corner of the U-shaped structure close to the second connection terminal.

In some examples, the plurality of sub-pixels further comprises a second sub-pixel, and the first sub-pixel and the second sub-pixel correspond to light-emitting elements emitting different colors; the display substrate further comprises a third reset voltage terminal, and the third reset voltage terminal is configured to be connected with the first terminal of the first reset sub-circuit of the second sub-pixel to provide the first reset voltage to the second sub-pixel; and the first reset voltage output by the first reset voltage terminal is different from the first reset voltage output by the third reset voltage terminal.

In some examples, the first reset voltage output by the first reset voltage terminal is lower than the first reset voltage output by the third reset voltage terminal.

In some examples, the plurality of sub-pixels further comprise a third sub-pixel; the first sub-pixel, the second sub-pixel, and the third sub-pixel respectively correspond to a blue light-emitting element, a red light-emitting element, and a green light-emitting element; and the third reset voltage terminal is further connected with the first terminal of the first reset sub-circuit of the third sub-pixel to provide the first reset voltage to the third sub-pixel.

In some examples, the display substrate further comprises a second reset voltage line extended along the first direction; the first sub-pixel, the second sub-pixel, and the third sub-pixel are in a same pixel row; the first reset voltage line electrically connects the first terminal of the first reset sub-circuit of the first sub-pixel with the first reset voltage terminal, and the second reset voltage line electrically connects the first terminal of the first reset sub-circuit of the second sub-pixel with the third reset voltage terminal.

At least an embodiment of the present disclosure further provides a drive method for any one of the above-mentioned display substrates, and the drive method comprises a reset stage and a light-emitting stage. The reset stage comprises: inputting the first reset control voltage and the first reset voltage to turn on the first reset sub-circuit, and applying the first reset voltage to the light-emitting element to reversely bias the light-emitting element. The light-emitting stage comprises: turning on the drive circuit and applying the drive current to the light-emitting element to enable the light-emitting element to emit light.

In some examples, the drive method further comprises a data write and compensation stage, and the data write and compensation stage comprises: inputting the first scanning signal, the second scanning signal, and the data signal to turn on the data write sub-circuit, the drive circuit, and the compensation sub-circuit, so that the data signal is written into the drive sub-circuit, the compensation sub-circuit stores the data signal, and the compensation circuit compensates the drive sub-circuit.

At least an embodiment of the present disclosure further provides a display device, comprising: the above-mentioned display substrate and a plurality of light-emitting elements. The plurality of light-emitting elements correspond to the plurality of sub-pixels in a one-to-one correspondence, each of the plurality of light-emitting elements comprises a first electrode and a second electrode, and the first electrode of each of the plurality of light-emitting elements is connected with the second terminal of the first reset sub-circuit of a corresponding sub-pixel.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objectives, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," and the like are only used to indicate relative position relationship, and when the position of the described object is changed, the relative position relationship may be changed accordingly.

In the field of OLED display, there are some challenges to realize high brightness and long-lifetime OLED display. For example, at present, the average service life of an OLED display screen is 3-4 years, while the average service life of a vehicle-mounted display is required to be 8-10 years. The service life of OLED display needs to improve to meet the demand of vehicle-mounted display field.

Figure 1A:
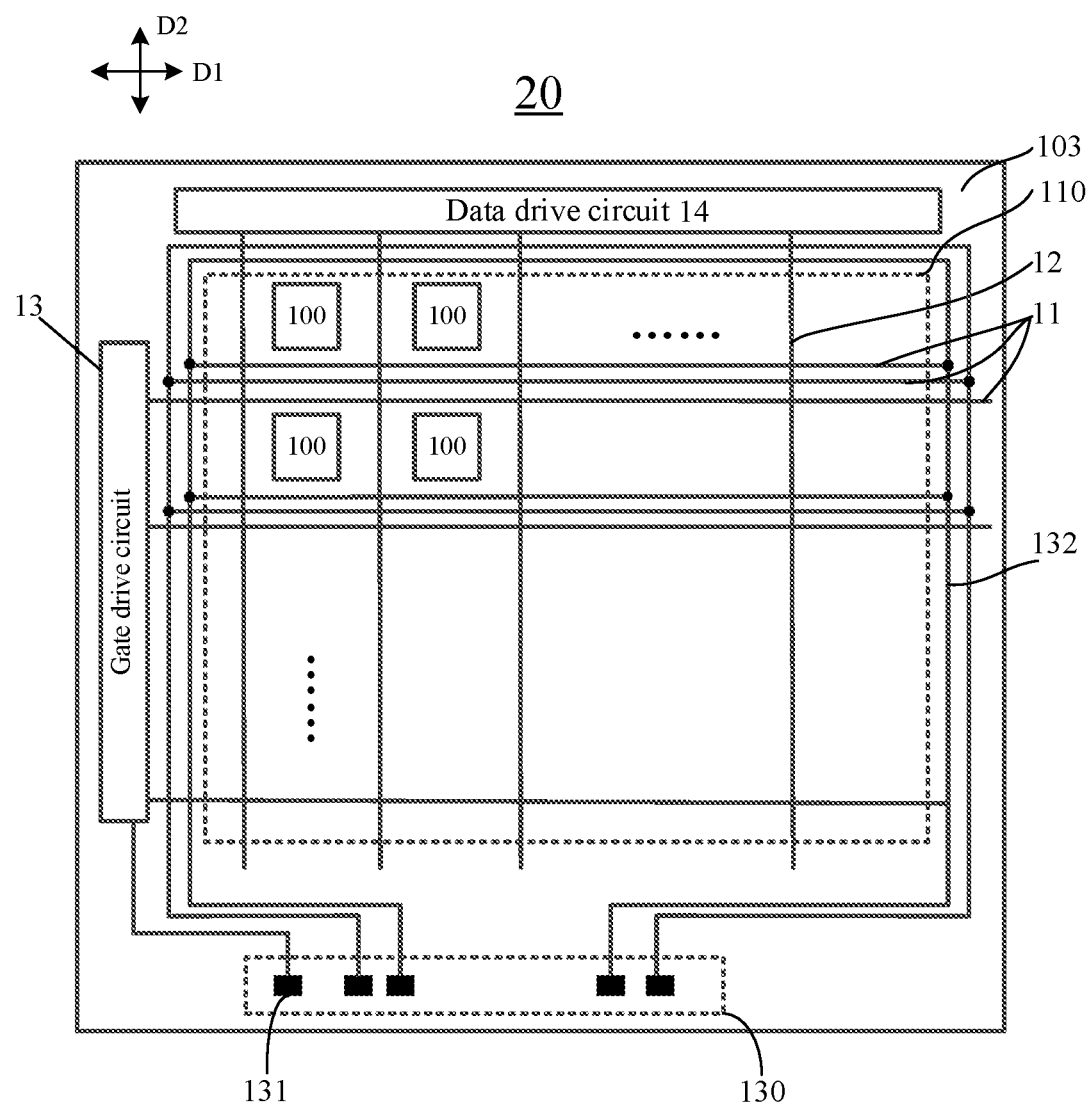
FIG. 1A is a first schematic diagram of a display substrate provided by at least one embodiment of the present disclosure.

FIG. 1A is a first schematic diagrams of a display substrate provided by at least one embodiment of the present disclosure. As shown in FIG. 1A, the display substrate 20 includes a display region 110 and a non-display region 103 outside the display region 110. For example, the non-display region 103 is in a peripheral region of the display region 110. The display substrate 20 includes a plurality of sub-pixels 100 in the display region 110. For example, the plurality of sub-pixels are arranged in an array. For example, the plurality of sub-pixels are arranged into a plurality of pixel rows and a plurality of pixel columns respectively along a first direction D1 and a second direction D2. For example, the pixel rows and the pixel columns do not necessarily extend strictly along a straight line, but may also extend along a curve line (for example, a broken line), and the curve line generally extends along the first direction D1 or the second direction D2 respectively. The first direction D1 and the second direction D2 are different; for example, the first direction D1 and the second direction D2 are orthogonal. For example, the plurality of sub-pixels can form pixel units according to a traditional RGB mode or a sub-pixel sharing mode (such as a pentile mode) to realize full-color display. The present disclosure does not limit the arrangement mode of plurality of sub-pixels and the mode to realize full-color display.

For example, as shown in FIG. 1A, the display substrate 20 further includes a plurality of conductive lines 11 and a plurality of conductive lines 12 located in the display region 110, and the plurality of conductive lines 11 and the plurality of conductive lines 12 intersect with each other to define a plurality of pixel regions in the display region 110, and a sub-pixel 100 is correspondingly arranged in each of the plurality of pixel regions. For example, the plurality of conductive lines 11 are extended along the first direction D1, and the plurality of conductive lines 12 are extended along the second direction D2. FIG. 1A only illustrates an approximate positional relationship among the plurality of conductive lines 11, the plurality of conductive lines 12, and the sub-pixels 100 in the display substrate, which can be specifically designed according to actual needs.

Each sub-pixel 100 includes a pixel circuit, and the pixel circuit is configured to drive the light-emitting element corresponding to the sub-pixel to emit light. The pixel circuit is, for example, a conventional pixel circuit, such as 2T1C (that is, two transistors and one capacitor) pixel circuit, a 4T2C pixel circuit, a 5T1C pixel circuit, a 7T1C pixel circuit, and other nTmC (n and m are positive integers) pixel circuits. In different embodiments, the pixel circuit may further include a compensation sub-circuit, the compensation sub-circuit includes an internal compensation sub-circuit or an external compensation sub-circuit, and the compensation sub-circuit may include transistors, capacitors, etc. For another example, the pixel circuit may further include a reset circuit, a light emission control sub-circuit, a detection circuit, etc., as needed.

For example, the display substrate 20 may further include a gate drive circuit 13 and a data drive circuit 14 in the non-display region 103. For example, the gate drive circuit 13 can be connected with the pixel circuit through some of the conductive lines 11, which are also called gate lines, to provide various scanning signals or control signals for sub-pixels. The data drive circuit 14 can be connected with the pixel circuit through a conductive line 12 to provide a data signal.

For example, a bonding region 130 is arranged in the non-display region 103, the bonding region is arranged with a plurality of bonding electrodes 131, the plurality of bonding electrodes 131 are connected with a circuit (for example, the gate drive circuit 13) or some of the conductive lines 11 and 12 in the display substrate 20 through routing lines, and are further configured to bond with an external circuit (for example, an IC chip), so as to provide an electrical signal (for example, a clock signal, a reset voltage signal, etc.) to the circuit or the signal line in the display substrate. For example, some of the conductive lines 11 are electrically connected with the bonding electrodes 131 through a routing line 132 in the non-display region 103. For example, the routing line 132 is annular and arranged around the display region 110. For example, the bonding electrode 131 may serve as a signal terminal for providing some signals, such as a reset voltage terminal or the like.

For example, the display substrate 20 may further include a control circuit (not shown). For example, the control circuit is configured to control the data drive circuit 14 to apply the data signal and control the gate drive circuit 13 to apply the scan signal or the control signal. An example of the control circuit is a timing control circuit (T-con). The control circuit can be in various forms, for example, including a processor and a memory. The memory includes an executable code, and the processor runs the executable code to execute the detection method described above.

For example, the processor may be a central processing unit (CPU) or other forms of processing devices with data processing capability and/or instruction execution capability, and may include a microprocessor, a programmable logic controller (PLC), etc.

For example, a storage device may include one or more computer program products, and the computer program product may include various forms of computer-readable storage media, such as volatile memory and/or nonvolatile memory. The volatile memory may include random access memory (RAM) and/or cache memory, for example. The nonvolatile memory may include, for example, a read-only memory (ROM), a hard disk, a flash memory, etc. One or more computer program instructions can be stored on the computer-readable storage medium, and the processor can run the functions desired by the program instructions. Various applications and various data can also be stored in the computer-readable storage medium.

Figure 1B:
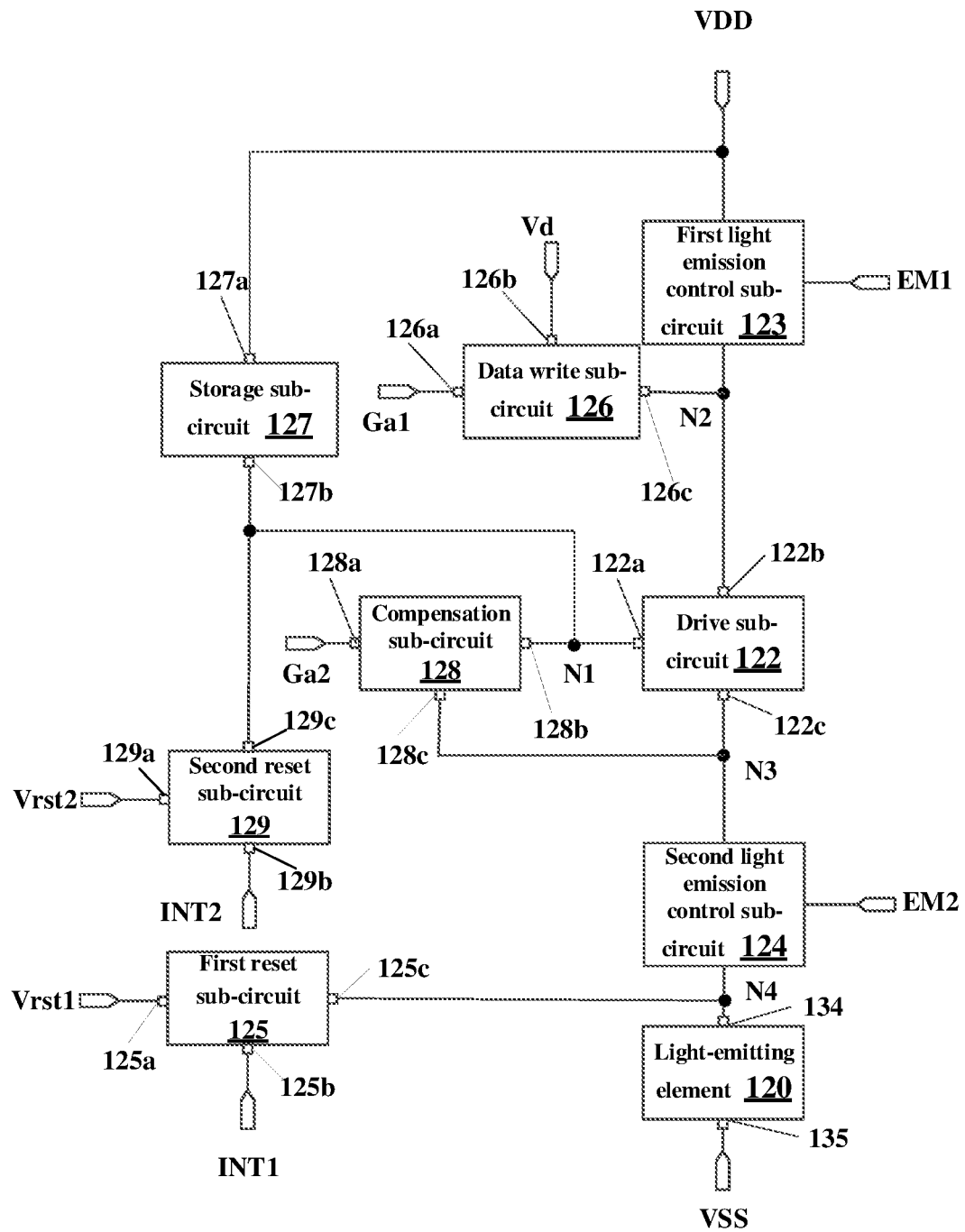
FIG. 1B is a first pixel circuit diagram of a display substrate provided by at least one embodiment of the present disclosure.

FIG. 1B is a first pixel circuit diagram of a display substrate provided by at least one embodiment of the present disclosure. As shown in FIG. 1B, the pixel circuit includes a drive sub-circuit 122, a data write sub-circuit 126, a compensation sub-circuit 128, a storage sub-circuit 127, and a first reset sub-circuit 125.

The drive sub-circuit 122 includes a control terminal 122a, a first terminal 122b, and a second terminal 122c, and the drive sub-circuit 122 is configured to be connected with the light-emitting element 120 and control the drive current flowing through the light-emitting element 120. The control terminal 122a of the drive sub-circuit 122 is connected with a first node N1, the first terminal 122b of the drive sub-circuit 122 is connected with a second node N2, and the second terminal 122c of the drive sub-circuit 122 is connected with a third node N3.

The data write sub-circuit 126 includes a control terminal 126a, a first terminal 126b, and a second terminal 126c. The control terminal 126a is configured to receive a first scanning signal Ga1, the first terminal 126b is configured to receive a data signal Vd, and the second terminal 126c is connected with a first terminal 122a (that is, the second node N2) of the drive sub-circuit 122. The data write sub-circuit 126 is configured to write the data signal Vd to the first terminal 122b of the drive sub-circuit 122 in response to the first scanning signal Ga1. For example, the first terminal 126b of the data write sub-circuit 126 is connected with a conductive line 12 functioning as a data line to receive the data signal Vd, and the control terminal 126a is connected with, for example, a conductive line 11, to receive the first scanning signal Ga1. For example, in a data write and compensation stage, the data write sub-circuit 126 can be turned on in response to the first scanning signal Ga1, so that the data signal can be written to the first terminal 122b (the second node N2) of the drive sub-circuit 122 and stored in the storage sub-circuit 127, so that, for example, the drive current for driving the light-emitting element 120 to emit light can be generated according to the data signal in a light-emitting stage.

The compensation sub-circuit 128 includes a control terminal 128a, a first terminal 128b and a second terminal 128c. the control terminal 128a of the compensation sub-circuit 128 is configured to receive a second scanning signal Ga2, the first terminal 128b and the second terminal 128c of the compensation sub-circuit 128 are respectively electrically connected with a control terminal 122a of the drive sub-circuit 122 and a second terminal 122c of the drive sub-circuit 122, and the compensation sub-circuit 128 is configured to perform threshold compensation on the drive sub-circuit 122 in response to the second scanning signal Ga2.

The memory sub-circuit 127 includes a first terminal 127a and a second terminal 127b. The first terminal 127a of the memory sub-circuit 127 is configured to receive a first power supply voltage VDD, and the second terminal 127b of the memory sub-circuit 127 is electrically connected with the control terminal 122a of the drive sub-circuit. For example, in the data write and compensation stage, the compensation sub-circuit 128 can be turned on in response to the second scanning signal Ga2, so that the data signal written by the data write sub-circuit 126 can be stored in the storage sub-circuit 127. Meanwhile, the compensation sub-circuit 128 can electrically connect the control terminal 122a of the drive sub-circuit 122 and the second terminal 122c of the drive sub-circuit 122, so that the related information of the threshold voltage of the drive sub-circuit 122 can be correspondingly stored in the storage sub-circuit, so that, for example, the stored data signal and the threshold voltage can be used to control the drive sub-circuit 122 in a light-emitting stage, thereby compensating the output of the drive sub-circuit 122.

The first reset sub-circuit 125 includes a control terminal 125a, a first terminal 125b, and a second terminal 125c. The control terminal 125a of the first reset sub-circuit is configured to receive a first reset control voltage Vrst1, the first terminal 125b of the first reset sub-circuit is configured to receive a first reset voltage Vint1, and the second terminal 125c of the first reset sub-circuit is configured to be connected with the light-emitting element 120. The first reset sub-circuit 125 is configured to apply the first reset voltage Vint1 to the light-emitting element 120 in response to the first reset control voltage Vrst1 to reversely bias the light-emitting element 120.

The first reset sub-circuit 125 is connected with the first reset voltage terminal INT1 and the first terminal 122b (a fourth node N4) of the light-emitting element 122, and is configured to apply the first reset voltage Vint1 to the first terminal of the light-emitting element 120 in response to the first reset control voltage Vrst1. For example, in a reset stage, the first reset sub-circuit 125 can be turned on in response to a reset signal, so that the first reset voltage Vint1 can be applied to the first terminal of the light-emitting element 120 and the first node N1, and the light-emitting element 120 can be reset by reversely biasing the light-emitting element 120, which can help to eliminate the influence of the previous light-emitting stage.

For example, the light-emitting element 120 includes a first terminal (also called as a first electrode) 134 and a second terminal (also called as a second electrode) 135. The first terminal 134 of the light-emitting element 120 is configured to be connected with the second terminal 122c of the drive sub-circuit 122, and the second terminal 135 of the light-emitting element 120 is configured to be connected with the second voltage terminal VSS. For example, in one example, as shown in FIG. 1B, the first terminal 134 of the light-emitting element 120 may be connected with the third node N3 through a second light emission control sub-circuit 124. Embodiments of the present disclosure include but are not limited to this case.

For example, the light-emitting element 120 is embodied as a light-emitting diode (LED), such as an organic light-emitting diode (OLED), a quantum dot light-emitting diode (QLED), or an inorganic light-emitting diode, such as a Micro LED or a Micro OLED. For example, the light-emitting element 120 may be in a top emission structure, a bottom emission structure, or a double-sided emission junction. The light-emitting element 120 can emit red light, green light, blue light, or white light. Embodiments of the present disclosure do not limit the specific structure of the light-emitting element. Reversely biasing the light-emitting element 120 means that the cathode voltage of the light-emitting element 120 is greater than the anode voltage, and the light-emitting element 120 will not emit light under the case where the light-emitting element 120 is reversely biased.

For example, as shown in FIG. 1B, the first terminal 134 of the light-emitting element 120 is the anode of the light-emitting element 120, and the second terminal 135 is the cathode of the light-emitting element 120. For example, the second terminal 120 receives a second power supply voltage VSS. For example, the pixel circuits have a common cathode structure. In this case, applying the first reset voltage Vint1 to the light-emitting element 120 to reversely bias the light-emitting element 120 means that the first reset voltage Vint1 is lower than the second power supply voltage VSS. In other examples, according to the change of circuit structure, the pixel circuits can also have a common anode structure, which is not limited by the embodiments of the present disclosure.

Figure 2A:
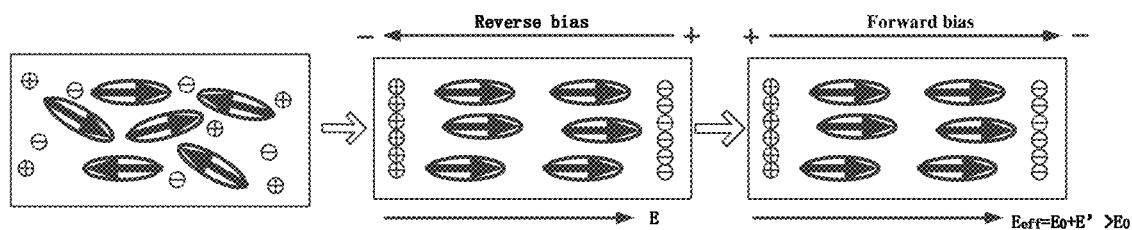
FIG. 2A shows a schematic diagram of an action mechanism of reverse bias on a light-emitting element.

The inventor found that the reversely biasing of the light-emitting element 120 is helpful to slow down the brightness attenuation of the light-emitting element and prolong the lifetime of the light-emitting element. FIG. 2A shows a schematic diagram of an action mechanism of reversely biasing on a light-emitting element. For example, there are randomly and disorderly distributed impurity ions and permanent dipoles in the light-emitting element freshly manufactured, and the disordered built-in electric field generated by the impurity ions and dipoles have an adverse effect on the light-emitting efficiency of the light-emitting element under forward bias. After applying a reverse bias to the light-emitting element, the impurity ions and dipoles are directionally distributed under the action of the reverse bias, and a built-in electric field E' is formed. Then a forward bias is applied to the light-emitting element, the electric field generated by the forward bias is E0, and the final effective electric field is Eeff=E0+E'>E0, so that higher current density and luminous intensity can be obtained under the same bias voltage, thus reducing the bias voltage and relieving the influence of the bias voltage on the luminescent material, further delaying the brightness attenuation of the light-emitting element and prolonging the lifetime of the light-emitting element.

For another example, because the light-emitting element is under forward bias in the light-emitting stage, by reversely biasing the light-emitting element in the reset stage, the unfavorable residual electric field generated in the light-emitting element by the forward bias can be eliminated. Therefore, the light-emitting element is alternately under the action of electric fields of forward bias and reverse bias, which is beneficial to eliminating the adverse effects of bias in a single direction on light-emitting materials, thereby prolonging the service life of the light-emitting element.

LT97 and LT95 are usually used as parameters to measure OLED's lifetime. The time it takes for the initial brightness of OLED to decrease from 100% to 97% is called LT97, and the time it takes for the initial brightness of OLED to decrease from 100% to 95% is called LT95.

Figure 2B:
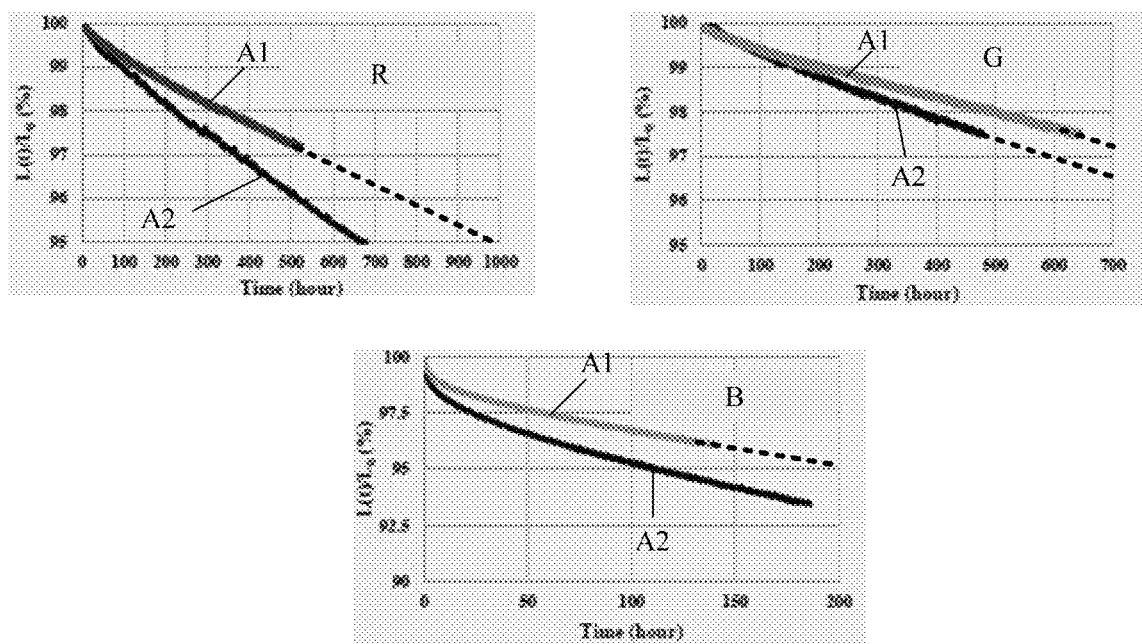
FIG. 2B is a time-brightness curve chart of a display substrate provided by at least one embodiment of the present disclosure.

FIG. 2B respectively shows lifetime vs. brightness comparison curve diagrams for driving red OLED, green OLED, and blue OLED with the pixel circuit provided by the embodiments of the present disclosure (corresponding to curve A1) as well as with constant current (CC) (corresponding to curve A2), where the solid line represents the test value and the dashed line represents the estimated value obtained according to the test value.

As shown in FIG. 2B, the LT97 and the LT95 of the red OLED(R) driven by the pixel circuit provided by the embodiments of the present disclosure are 499 hours and 982 hours, respectively. The LT97 of the red OLED(R) driven by a direct current is 369 hours, and the LT95 is 666 hours. By driving the red OLED with the pixel circuit provided by the embodiments of the present disclosure, the LT97 and the LT95 of the red OLED are increased by 35% and 47%, respectively.

As shown in FIG. 2B, the LT97 of the green OLED(G) driven by the pixel circuit provided by the embodiments of the present disclosure reaches over 700 hours and an estimated value is 785 hours. The LT97 of the green OLED(G) driven by a direct current is 601 hours. By driving the green OLED with the pixel circuit provided by the embodiments of the present disclosure, the LT97 of the green OLED is improved by 30.6%.

As shown in FIG. 2B, the LT97 of the blue OLED(B) driven by the pixel circuit provided by the embodiments of the present disclosure is 83 hours. The LT97 of the blue OLED(B) driven by a direct current is 41 hours. By driving the blue OLED with the pixel circuit provided by the embodiments of the present disclosure, the LT97 of the blue OLED is nearly doubled.

For example, as shown in FIG. 1B, the pixel circuit may further include a second reset sub-circuit 129. The second reset sub-circuit 129 includes a control terminal 129a, a first terminal 129b, and a second terminal 129c. The control terminal 129a of the second reset sub-circuit 129 is configured to receive a second reset control voltage Vrst2, the first terminal 129b is configured to receive a second reset voltage Vint2, and a second terminal 129c is connected with the control terminal 122a of the drive sub-circuit 122. The second reset sub-circuit 129 is configured to apply the second reset voltage Vint2 to the control terminal 122a of the drive sub-circuit 122 in response to the second reset control voltage Vrst2 to reset the control terminal 122a of the drive sub-circuit.

For example, as shown in FIG. 1B, the pixel circuit may further include a first light emission control sub-circuit 123. The first light emission control sub-circuit 123 is connected with the first terminal 122b (the second node N2) of the drive sub-circuit 122 and the first voltage terminal VDD, and the first light emission control sub-circuit 123 is configured to apply a first power supply voltage VDD of the first voltage terminal VDD to the first terminal 122b of the drive sub-circuit 122 in response to a first light emission control signal EM1.

For example, as shown in FIG. 1B, the pixel circuit may further include a second light emission control sub-circuit 124. The second light emission control sub-circuit 124 is connected with a second light emission control terminal EM2, the first terminal 134 of the light-emitting element 120, and the second terminal 122c of the drive sub-circuit 122, and the second light emission control sub-circuit 124 is configured to enable a drive current to be applied to the light-emitting element 120 in response to the second light emission control signal EM2.

For example, in a light-emitting stage, the second light emission control sub-circuit 123 is turned on in response to the second light emission control signal EM2 provided by the second light emission control terminal EM2, so that the drive sub-circuit 122 can be electrically connected with the light-emitting element 120 through the second light emission control sub-circuit 123, thereby driving the light-emitting element 120 to emit light under the control of the drive current. In a non-light-emitting stage, the second light emission control sub-circuit 123 is turned off in response to the second light emission control signal EM2, thereby preventing a current from flowing through the light-emitting element 120 to emit light, so as to improve the contrast of the corresponding display device.

For another example, in a reset stage, the second light emission control sub-circuit 124 may also be turned on in response to the second light emission control signal EM2, so that the drive sub-circuit 122 and the light-emitting element 120 may be reset by a combination of the first reset sub-circuit 125 and the second reset sub-circuit 129.

For example, the second light emission control signal EM2 may be the same as or different from the first light emission control signal EM1, for example, the second light emission control signal EM2 and the first light emission control signal EM1 may be connected with the same signal output terminal or different signal output terminals, for example, transmitted through the same light emission control line or different light emission control lines.

It should be noted that, in the explanation of the embodiments of the present disclosure, the first node N1, the second node N2, the third node N3, and the fourth node N4 do not necessarily represent actual components, but represent convergence points of related circuit connections in the circuit diagram.

It should be noted that in the description of the embodiments of the present disclosure, the symbol Vd can represent both a data signal terminal and the level of a data signal. Similarly, the symbols Ga1 and Ga2 may represent the first scanning signal and the second scanning signal, and may also represent the first scanning signal terminal and the second scanning signal terminal. Vrst1 can represent both the first reset control terminal and the first reset control voltage, and the symbol VDD can represent both the first voltage terminal and the first power supply voltage, which is the same for the following embodiments and will not be described again.

Figure 3A:
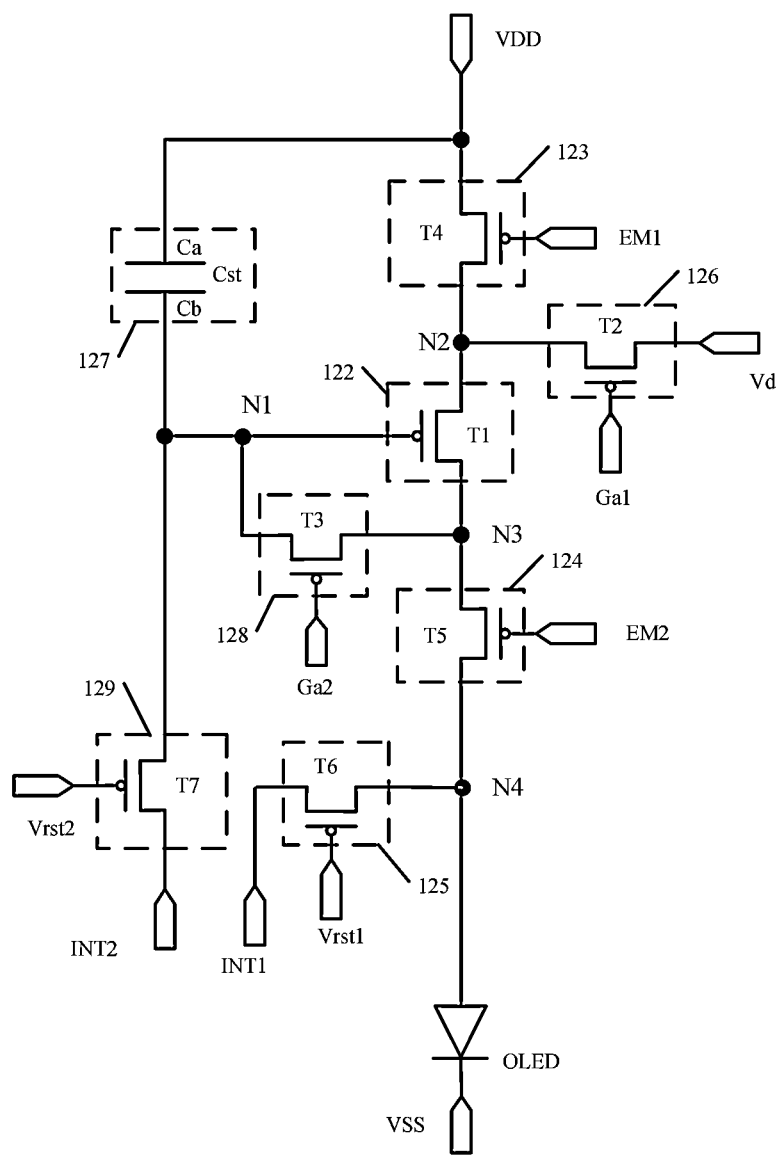
FIG. 3A is a second pixel circuit diagram of a display substrate provided by at least one embodiment of the present disclosure.

FIG. 3A is a circuit diagram of a specific implementation example of the pixel circuit shown in FIG. 1B. As shown in FIG. 3A, the pixel circuit includes a first transistor T1, a second transistor T2, a third transistor T3, a fourth transistor T4, a fifth transistor T5, a sixth transistor T6, a seventh transistors T7, and a storage capacitor Cst. For example, the first transistor T1 is used as a drive transistor, and other transistors, such as the second transistor to the seventh transistor are used as switching transistors.

For example, as shown in FIG. 3A, the drive sub-circuit 122 may be implemented as the first transistor T1. A gate electrode of the first transistor T1 serves as the control terminal 122a of the drive sub-circuit 122 and is connected with the first node N1. A first electrode of the first transistor T1 serves as the first terminal 122b of the drive sub-circuit 122 and is connected with the second node N2. A second electrode of the first transistor T1 serves as the second terminal 122c of the drive sub-circuit 122 and is connected with the third node N3.

For example, as shown in FIG. 3A, the data write sub-circuit 126 may be implemented as a second transistor T2. The gate electrode, the first electrode, and the second electrode of the second transistor T2 respectively serve as the first terminal 126a, the second terminal 126b, and the third terminal 126c of the data write sub-circuit 126. The gate electrode of the second transistor T2 is connected with a first scanning line (the first scanning signal terminal Ga1) to receive a first scanning signal, the first electrode of the second transistor T2 is connected with a data line (the data signal terminal Vd) to receive a data signal, and the second electrode of the second transistor T2 is connected with the first terminal 122b (second node N2) of the drive sub-circuit 122.

For example, as shown in FIG. 3A, the compensation sub-circuit 128 may be implemented as the third transistor T3. A gate electrode, a first electrode, and a second electrode of the third transistor T3 serve as the first terminal 128a, the second terminal 128b, and the third terminal 128c of the compensation sub-circuit 128, respectively. The gate electrode of the third transistor T3 is connected with a second scanning line (the second scanning signal terminal Ga2) to receive a second scanning signal Ga2, the first electrode of the third transistor T3 is connected with the control terminal 122a (the first node N1) of the drive sub-circuit 122, and the second electrode of the third transistor T3 is connected with the second terminal 122c (third node N3) of the drive sub-circuit 122.

For example, as shown in FIG. 3A, the storage sub-circuit 127 can be implemented as a storage capacitor Cst. The storage capacitor Cst includes a first capacitor electrode Ca and a second capacitor electrode Cb, which serve as the first terminal 127a and the second terminal 127b of the storage sub-circuit 127, respectively. The first capacitor electrode Ca is coupled to, for example, the first voltage terminal VDD, and the second capacitor electrode Cb is coupled to, for example, the control terminal 122a of the drive sub-circuit 122.

For example, as shown in FIG. 3A, the first light emission control sub-circuit 123 may be implemented as a fourth transistor T4. A gate electrode of the fourth transistor T4 is connected with a first light emission control line (the first light emission control terminal EM1) to receive the first light emission control signal EM1, a first electrode of the fourth transistor T4 is connected with the first voltage terminal VDD to receive the first power supply voltage VDD, and a second electrode of the fourth transistor T4 is connected with the first terminal 122b (the second node N2) of the drive sub-circuit 122.

For example, the light-emitting element 120 can be embodied as an OLED, and the first electrode and the second electrode of the OLED serve as the first terminal 134 and the second terminal 135 of the light-emitting element 120, respectively. The first electrode (e.g., anode) is connected with the fourth node N4 and is configured to receive the drive current from the second terminal 122c of the drive sub-circuit 122 through the second light emission control sub-circuit 124, and the second electrode (e.g., cathode) is connected with the second voltage terminal VSS to receive the second power supply voltage.

For example, the second light emission control sub-circuit 124 may be implemented as a fifth transistor T5. A gate electrode of the fifth transistor T5 is connected with a second light emission control line (the second light emission control terminal EM2) to receive the second light emission control signal EM2, a first electrode of the fifth transistor T5 is connected with the second terminal 122c (the third node N3) of the drive sub-circuit 122, and a second electrode of the fifth transistor T5 is connected with the first terminal 134 (the fourth node N4) of the light-emitting element 120.

For example, the first reset sub-circuit 125 may be implemented as a sixth transistor T6. A gate electrode, the first electrode, and the second electrode of the sixth transistor T6 serve as the first terminal 125a, the second terminal 125b, and the third terminal 125c of the first reset sub-circuit 125, respectively. The gate electrode of the sixth transistor T6 is connected with the first reset control terminal Vrst1 to receive the first reset control voltage Vrst1, the first electrode of the sixth transistor T6 is connected with a first reset voltage terminal INT1 to receive the first reset voltage Vint1, and the second electrode of the sixth transistor T6 is configured to be connected with the fourth node N4.

For example, the second reset sub-circuit 129 can be implemented as a seventh transistor T7. A gate electrode, a first electrode, and a second electrode of the seventh transistor T7 respectively serve as the control terminal, the first terminal, and the second terminal of the second reset sub-circuit 129. The gate electrode of the seventh transistor T7 is configured to be connected with the second reset control terminal Vrst2 to receive the second reset control voltage Vrst2, the first electrode of the seventh transistor T7 is connected with a second reset voltage terminal INT2 to receive the second reset voltage Vint2, and the second electrode of the seventh transistor T7 is connected with the first node N1.

It should be noted that all the transistors used in the embodiments of the present disclosure can be thin film transistors, field effect transistors, or other switching devices with the same characteristics, and all the embodiments of the present disclosure are described by taking thin film transistors as an example. The source electrode and the drain electrode of the transistor used here can be symmetrical in structure, so there can be no difference in structure between the source electrode and the drain electrode. In the embodiments of the present disclosure, in order to distinguish the two electrodes of the transistor except the gate electrode, it is directly described that one electrode is the first electrode and the other electrode is the second electrode. In addition, transistors can be divided into N-type transistors and P-type transistors according to their characteristics. Under the case where the transistor is a P-type transistor, the turn-on voltage is a low-level voltage (for example, 0V, −5V, −10V or other suitable voltage), and the turn-off voltage is a high-level voltage (for example, 5V, 10V or other suitable voltage). Under the case where the transistor is an N-type transistor, the turn-on voltage is a high-level voltage (for example, 5V, 10V or other suitable voltage), and the turn-off voltage is a low-level voltage (for example, 0V, −5V, −10V or other suitable voltage). For example, as shown in FIG. 3, the first transistor T1 to the seventh transistor T7 are all p-type transistors, such as low-temperature polysilicon thin film transistors. However, the embodiments of the present disclosure do not limit the type of transistors, and under the case where the type of transistor changes, the connection relationship in the circuit can be adjusted accordingly.

Figure 3B:
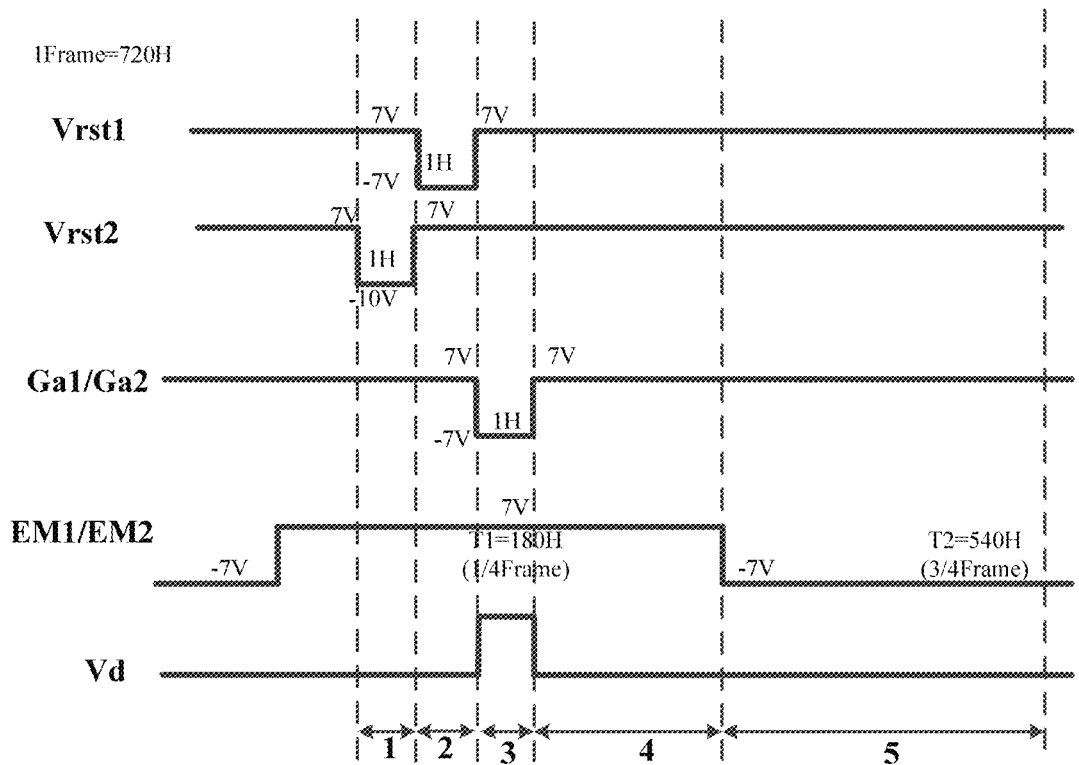
FIG. 3B is a timing signal diagram of a pixel circuit provided by at least one embodiment of the present disclosure.

The working principle of the pixel circuit as shown in FIG. 3A will be described below with reference to the signal timing diagram as shown in FIG. 3B. As shown in FIG. 3B, the display process of each frame image includes three stages, which are a first reset stage 1, a second reset stage 2, a data write and compensation stage 3, a reset voltage holding stage 4, and a light-emitting stage 5. FIG. 3B shows the time sequence waveform, amplitude and duration of each signal in each stage. For example, the display panel includes 720 rows (720H) of pixels, that is, the duration of one frame is the time required for each signal to scan 720 rows of pixels, and FIG. 3B shows the time for each signal at an active level (such as a low level) within one frame. For example, the active levels of the first reset control voltage Vrst1 and the second reset control voltage Vrst1 are the time required for scanning one row of pixels (1H). For example, the duration (that is, the period) of one frame of display image is ⅙₀ second, that is, the frequency of each signal is 60 Hz. In this case, the time required for scanning one row of pixels (1H) is 1/(60*720) seconds.

As shown in FIG. 3B, in the present embodiment, the first scanning signal Ga1 and the second scanning signal Ga2 adopt the same signal, and the first light emission control signal EM1 and the second light emission control signal EM2 adopt the same signal. However, this is not taken as a limitation to the present disclosure. In other embodiments, different signals may be used as the first scanning signal Ga1 and the second scanning signal Ga2, and different signals may be used as the first light emission control signal EM1 and the second light emission control signal EM2, respectively.

In the first reset stage 1, the second reset control voltage Vrst2 is input to turn on the seventh transistor T7, and the second reset voltage Vint2 is applied to the gate electrode of the first transistor T1, thereby resetting the first node NE For example, the second reset voltage Vint2 can be −3.5 V to −3V.

In the second reset stage 2, the first reset control voltage Vrst1 is input to turn on the sixth transistor T6, to apply the first reset voltage Vint1 to the first electrode of the OLED to reset the fourth node N4. The first reset voltage Vint1 is lower than the second power supply voltage VSS, so that the OLED is reversely biased. For example, the first reset voltage Vint1 can be −7 V to −5V, such as −7V to −6.5V or −5.5V to −5 v. For example, the second power supply voltage VSS can be −5V to −4.5v. From the second reset stage 2 until the light-emitting stage 5, the voltage of the first electrode of the OLED is kept at the first reset voltage Vint1, and the OLED is continuously reversely biased.

In the present embodiment, the first reset control voltage Vrst1 and the second reset control voltage Vrst2 are asynchronous signals with different amplitudes. In other embodiments, the first reset control voltage Vrst1 and the second reset control voltage Vrst2 may also be the same reset signal, that is, the first reset stage 1 and the second reset stage 2 are simultaneously performed, which is not limited by the embodiments of the present disclosure.

In the data write and compensation stage 3, the first scanning signal Ga1, the second scanning signal Ga2, and the data signal Vd are input, the second transistor T2 and the third transistor T3 are turned on, the data signal Vd is written into the second node N2 by the second transistor T2, to charge the first node N1 through the first transistor T1 and the third transistor T3 until the potential of the first node N1 changes to Vd+Vth and the first transistor T1 is turned off, where Vth is the threshold voltage of the first transistor T1. The potential of the first node N1 is stored in the storage capacitor Cst to be maintained, that is, the voltage information with the data signal and the threshold voltage Vth is stored in the storage capacitor Cst, and is configured to provide grayscale display data and compensate the threshold voltage of the first transistor T1 in the subsequent light-emitting stage.

In the reset voltage holding stage 4, the first light emission control signal EM1 and the second light emission control signal EM2 are input to turn off the fourth transistor T4 and the fifth transistor T5, so as to hold the first reset voltage Vint1 on the first electrode of the OLED. For example, although the sixth transistor T6 is turned off by the high-level first reset control voltage Vrst2, the potential on the first electrode of the OLED is maintained because the fifth transistor T5 is turned off. By providing the reset voltage holding stage 4, the holding time of the first reset voltage Vint1 can be adjusted, that is, the time duration that the light-emitting element is in the reverse bias state can be adjusted. For example, by extending the reset voltage holding stage 4, the time that the light-emitting element is in the reverse bias state can be prolonged, that is, the duty ratio of the light-emitting element can be improved.

For example, the duty ratio of the light-emitting element is 75%, that is, the percentage of the light-emitting time (corresponding to the light-emitting stage) of the light-emitting element in one period (for example, one frame) is 75%. In the light-emitting stage, the light-emitting element is in a forward bias state and emits light. In the non-light-emitting phase of the light-emitting element, the light-emitting element is in a reverse bias state and does not emit light, that is, the time when the light-emitting element is in a reverse bias state accounts for 25% of the whole period.

In the light-emitting stage 5, the first light emission control signal EM1 and the second light emission control signal EM2 are input to turn on the fourth transistor T4, the fifth transistor T5, and the first transistor T1, and the fifth transistor T5 applies a drive current to the OLED to make the OLED emit light. The value of the drive current I flowing through the OLED can be obtained according to the following formula:

$$I=K(V_{GS}-Vth)^2=K[(Vdata+Vth-VDD)-Vth]^2=K(Vdata-VDD)^2,$$

where K is the conductivity of the first transistor.

In the above formula, Vth represents the threshold voltage of the first transistor T1, $V_{GS}$ represents the voltage between the gate electrode and the source electrode (here, the first electrode) of the first transistor T1, and K is a constant value related to the first transistor T1 itself. It can be seen from the above calculation formula of the drive current I that the drive current I flowing through OLED is no longer related to the threshold voltage Vth of the first transistor T1, so that the compensation for the pixel circuit can be realized, the problem that the threshold voltage of the drive transistor (the first transistor T1 in the embodiments of the present disclosure) drifts due to the process and long-time operation is solved, and the influence the problem imposes on the drive current I is eliminated, thereby improving the display effect of the display device adopting the drive transistor.

For example, the display substrate 20 may include the first reset voltage terminal INT1, and the first reset voltage terminal INT1 is configured to be connected with the first terminal 125a of the first reset sub-circuit 125 to provide the first reset voltage Vint1 for the sub-pixel.

With reference to FIG. 1A, for example, the first reset voltage terminal INT1 may be a bonding electrode 131 located in the bonding region 130. For example, the first reset voltage terminal INT1 receives the first reset voltage Vint1 from an external circuit (e.g., flexible printed circuit board FPC) bonded to the bonding electrode 131, and transmits the first reset voltage Vint1 to the sub-pixel 100 through the routing line 132.

For example, the first reset voltage terminal INT1 is configured to output a pulse voltage as the first reset voltage Vint1.

For example, the display substrate 20 may further include the second reset voltage terminal INT2. The second reset voltage terminal INT2 is configured to be connected with the first terminal 129a of the second reset sub-circuit 129 to provide the second reset voltage Vint2. With reference to FIG. 1A, for example, the first reset voltage terminal INT1 may be another bonding electrode 131 located in the bonding region 130.

For example, the first reset voltage terminal INT1 is different from the second reset voltage terminal INT2, that is, the first reset voltage terminal INT1 and the second reset voltage terminal INT2 correspond to different bonding electrodes 131. For example, the first reset voltage Vint1 is different from the second reset voltage Vint2.

The first reset voltage Vint1 needs to be lower than the second power supply voltage VSS to reversely bias the light-emitting element. In addition, because the second reset voltage Vint2 is configured to reset the gate electrode of the first transistor T1 as the drive transistor, if the second reset voltage Vint2 is too small, the gate electrode of the first transistor T1 will not reach the compensation value Vd+Vth in the data write and compensation stage, that is, the threshold voltage of the first transistor T1 will not be fully compensated, thus, the drive current in the light-emitting stage is still related to the threshold voltage Vth of the first transistor T1, resulting in the decrease of panel brightness uniformity.

Figure 3C:
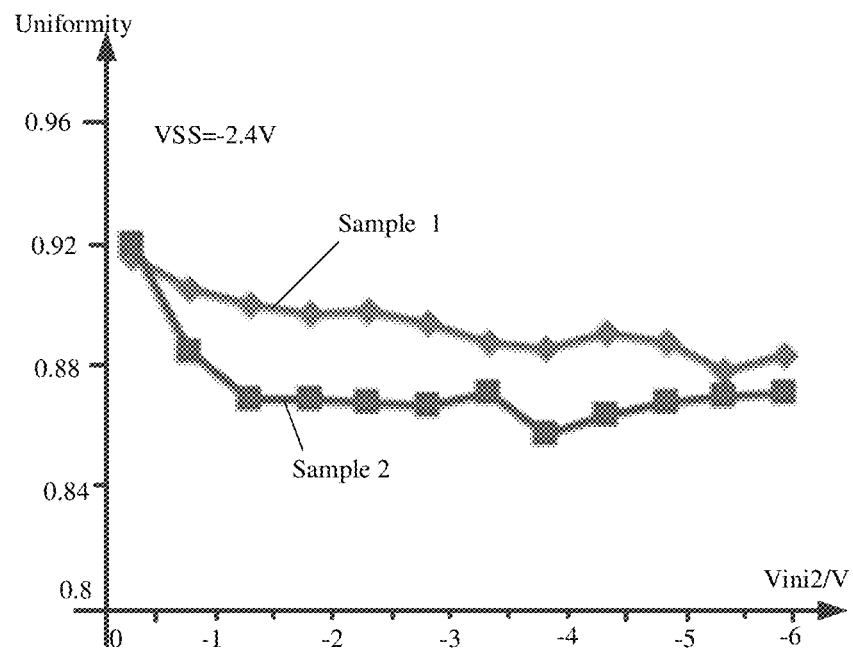
FIG. 3C is a curve chart of brightness uniformity vs. a second reset voltage of a display panel.

FIG. 3C shows a curve chart showing the variation of brightness uniformity with the second reset voltage Vint2 of two display panel samples (sample 1 and sample 2), both of which adopt the pixel circuit as shown in FIG. 3A as the drive circuit of the light-emitting element, and the second power supply voltage VSS is −2.4V. It can be seen from the figure that the test curves of the two samples are basically consistent, that is, with the decrease of the second reset voltage Vint2, the brightness uniformity of the display panel decreases.

Because the first reset voltage Vint1 and the second reset voltage Vint2 have different requirements, by connecting the first terminal 125a of the first reset sub-circuit 125 and the first terminal 129a of the second reset sub-circuit 129 to different reset voltage terminals (the first reset voltage terminal and the second reset voltage terminal) to receive different reset voltages, the values of the first reset voltage Vint1 and the second reset voltage Vint2 can respectively meet their respective requirements, thus ensuring that the light-emitting element is effectively reversely biased and meanwhile avoiding the insufficiency of compensation of the drive transistor, thereby improving the brightness uniformity of the display panel. For example, the second reset voltage Vint2 can be −3.5 V to −3 V. The first reset voltage Vint1 can be −5.5 V to −5 V. The second power supply voltage VSS can be −5V to −4.5V.

For example, the second reset voltage Vint2 output by the second reset voltage terminal INT2 is greater than the first reset voltage Vint1 output by the first reset voltage terminal INT1. For example, the sixth transistor T6 and the seventh reset transistor T7 have the same size and the same conduction condition. Accordingly, the second reset control voltage Vrst2 is greater than the first reset control voltage Vrst1.

For example, the plurality of sub-pixels includes a first sub-pixel and a second sub-pixel. The first sub-pixel and the second sub-pixel respectively correspond to light-emitting elements of different colors. The first terminal 125b of the first reset sub-circuit 125 of the pixel circuit of the first sub-pixel is configured to be connected with the first reset voltage terminal INT1 to provide a first reset voltage Vint1. For example, the display panel 20 further includes a third reset voltage terminal INT3, and the third reset voltage terminal INT3 is configured to be connected with the first terminal 125b of the first reset sub-circuit 125 of the second sub-pixel to provide the first reset voltage Vint1 for the second sub-pixel. With reference to FIG. 1A, for example, the third reset voltage terminal INT3 may be still another bonding electrode 131 located in the bonding region 130. For example, the first sub-pixel corresponds to a blue light-emitting element, and the second sub-pixel corresponds to a green light-emitting element or a red light-emitting element.

For example, the first reset voltage Vint1 output by the first reset voltage terminal INT1 and the first reset voltage Vint1 output by the third reset voltage terminal INT3 may be the same or different.

For example, because the properties of luminescent materials of light-emitting elements with different colors are different and the electric fields formed by impurity ions/dipoles in luminescent materials are also different, the values of reverse bias voltages of light-emitting elements may also be different. By providing different reset voltage terminals for the sub-pixels corresponding to light-emitting elements with different colors, the first reset voltage Vint1 of the sub-pixels with different light-emitting colors can be independently adjusted. For example, a preferred value of the first reset voltage Vint1 corresponding to light-emitting elements with different colors can be obtained by conducting experimental tests in advance, and then the range of output voltages of each reset voltage terminal can be set accordingly. For example, the first reset voltage Vint1 output by the first reset voltage terminal INT1 is lower than the first reset voltage Vint1 output by the third reset voltage terminal INT3.

For example, the plurality of sub-pixels further include a third sub-pixel, and the first sub-pixel, the second sub-pixel, and the third sub-pixel respectively correspond to the a blue light-emitting element, a red light-emitting element, and a green light-emitting element. For example, due to different properties or light-emitting mechanisms of light-emitting materials of light-emitting elements with different colors, the preferred values of reverse bias voltages (Vint1-VSS) of light-emitting elements with different colors are different. For example, the curves of reverse bias voltage vs. lifetime (for example, LT95) of light-emitting elements with different colors can be obtained through experiments, and then the first reset voltage Vint1 of the display substrate can be set based on the optimal value of reverse bias voltage obtained according to the experimental results.

Figure 4A:
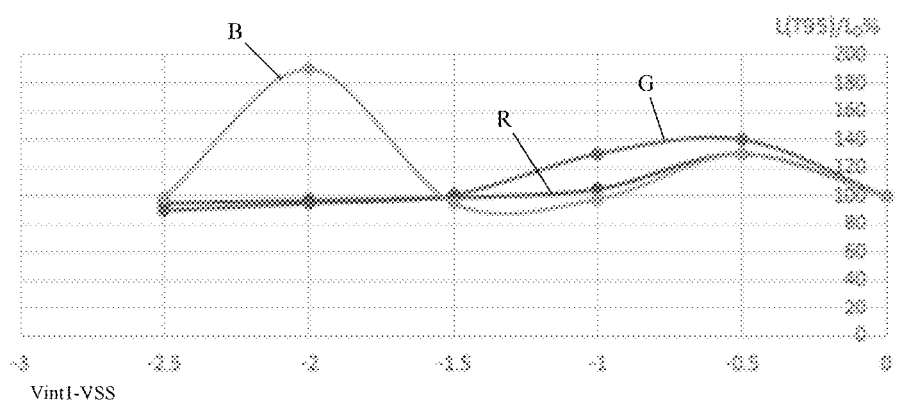
FIG. 4A is a curve chart of reverse bias voltage vs. lifetime of a light-emitting element adopting a drive method provided by at least one embodiment of the present disclosure.

FIG. 4A shows the reverse bias voltage vs. lifetime curve chart of light-emitting elements of three different colors (RGB) provided by the embodiments of the present disclosure. As shown in FIG. 4A, the horizontal axis represents the reverse bias voltage applied to each light-emitting element in the reset stage, that is, the difference value between the first reset voltage Vint1 and the second power supply voltage Vss. The vertical axis represents the percentage (L(T95)/L0%) of LT95 of the light-emitting element driven by the drive method provided by the embodiments of the present disclosure and LT95 of the light-emitting element driven by a constant current (CC), where the constant current drive voltage of light-emitting element R is 3.82V, the constant current drive voltage of light-emitting element G is 3.62V, and the constant current drive voltage of light-emitting element B is 3.85V.

As shown in FIG. 4A, for the light-emitting elements with the three colors, by choosing a reasonable value of the reverse bias voltage, the lifetime can be longer than that under constant current driving, that is, L(T95)/L0% is more than 100%. For example, as shown in FIG. 4A, the preferred values of the reverse bias voltages corresponding to the red light-emitting element (R) and the green light-emitting element (G) are relatively close, and are greater than the preferred value of the reverse bias voltage corresponding to the blue light-emitting element (B). For example, the red light-emitting element (R) and the green light-emitting element (G) are both phosphorescent light-emitting elements, and the blue light-emitting element (B) is a fluorescent light-emitting element.

For example, the reverse bias voltages of the red light-emitting element (R) and the green light-emitting element (G) can be in the range of −2.3V to −1.8V; for example, −2V. The reverse bias voltage of the blue light-emitting element (B) can be in the range of −1V to −0.4V; for example, −0.5V.

For example, it is known from experiments that the preferred values of the first reset voltages Vint1 corresponding to a red light-emitting element and a green light-emitting element are relatively close, so the first terminal 125b of the first reset sub-circuit 125 of the second sub-pixel (R) corresponding to the red light-emitting element in the display substrate and the first terminal 125b of the first reset sub-circuit 125 of the third sub-pixel (G) corresponding to the green light-emitting element in the display substrate can be connected with the same reset voltage terminal, and the first terminal 125b of the first reset sub-circuit 125 of the first sub-pixel (B) corresponding to the blue light-emitting element can be connected with a different reset voltage terminal. However, this is only an example of the present disclosure. In other examples, different devices can be selected for experiments to obtain different results and the display substrate is set accordingly, which is not limited by the embodiments of the present disclosure.

Figure 4B:
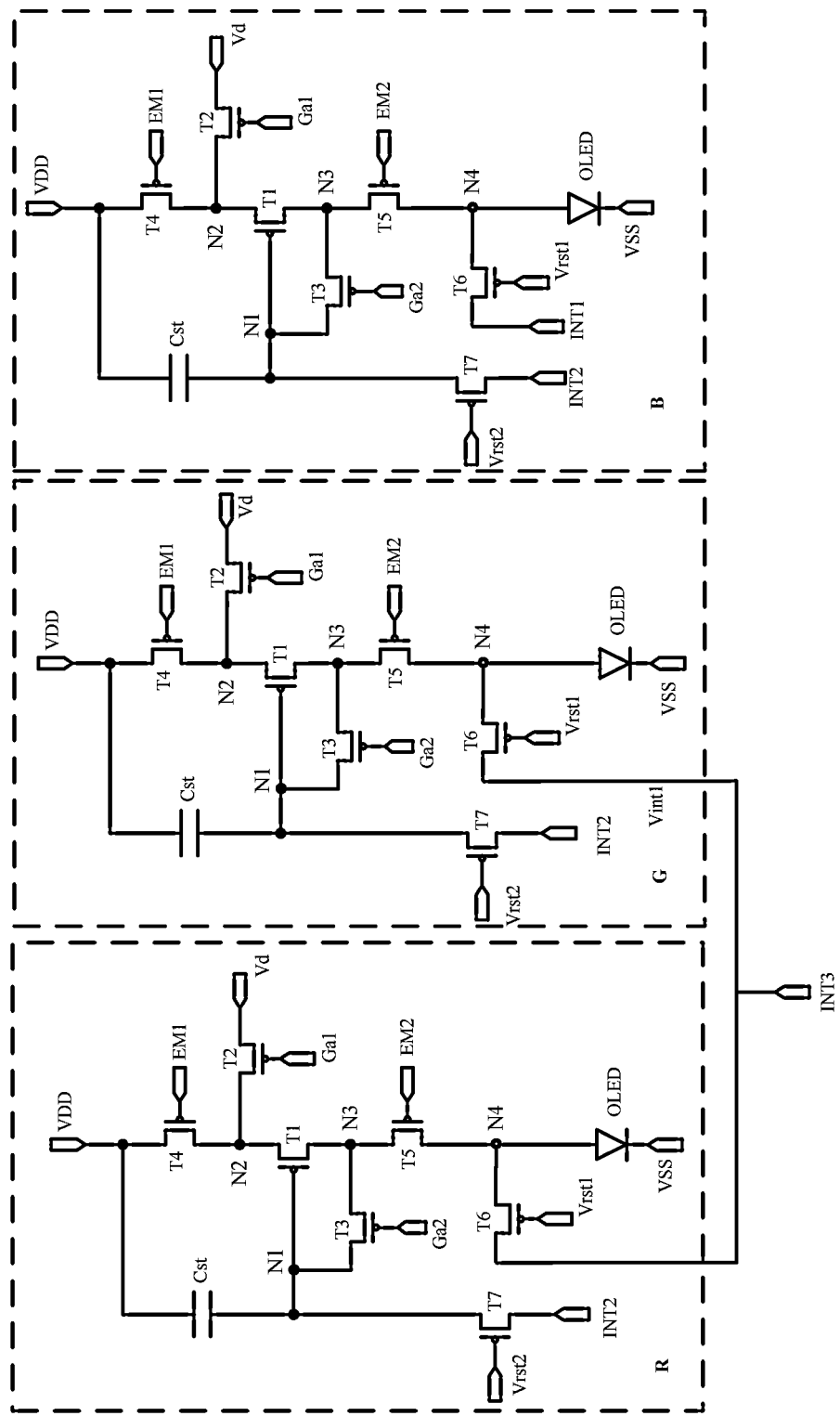
FIG. 4B is a third pixel circuit diagram of a display substrate provided by at least one embodiment of the present disclosure.

FIG. 4B is a schematic diagram of pixel circuit of a display substrate provided by another embodiment of the present disclosure. As shown in the figure, the third reset voltage terminal INT3 is connected with the first terminal of the first reset sub-circuit of the second sub-pixel (R) and the first terminal of the first reset sub-circuit of the third sub-pixel (G) to provide the first reset voltage Vint1, and the first reset voltage terminal INT1 is connected with the first terminal of the first reset sub-circuit of the first sub-pixel (G) to provide the first reset voltage Vint1. For example, the first reset voltage Vint1 output by the first reset voltage terminal INT3 ranges from −7V to −6.5V, and the first reset voltage Vint1 output by the third reset voltage terminal INT3 ranges from −5.5V to −5V. For example, the second power supply voltage VSS ranges from −4.5V to −4V.

For example, in the case where the second sub-pixel and the third sub-pixel are in the same pixel row, the first reset sub-circuit of the second sub-pixel and the first reset sub-circuit of the third sub-pixel are connected with the third reset voltage terminal INT3 through the same first reset voltage line. In the case where the second sub-pixel and the third sub-pixel are in different pixel rows, the first reset sub-circuit of the second sub-pixel and the first reset sub-circuit of the third sub-pixel are connected with the third reset voltage terminal INT3 through different first reset voltage lines.

In some other examples, the display substrate may further include a fourth reset voltage terminal, and the fourth reset voltage terminal is configured to be connected with the first terminal 125b of the first reset sub-circuit 125 of the third sub-pixel to provide the first reset voltage Vint1 for the third sub-pixel. For example, the fourth reset voltage terminal INT3 may be still another bonding electrode 131 in the bonding region 130. Therefore, first reset voltages Vint1 can be supplied to the pixel circuits corresponding to the red light-emitting element, the green light-emitting element, and blue light-emitting element, respectively.

The structure of the display substrate provided by at least one embodiment of the present disclosure is exemplarily explained below, taking the pixel circuit shown in FIG. 4B as an example, and in combination with FIG. 5A-FIG. 5C, FIG. 6, FIG. 7A-FIG. 7B, FIG. 8A-FIG. 8B, FIG. 9A-FIG. 9B, and FIG. 10. In case of the illustrated embodiment illustrated in the figures, the first terminals of the first reset sub-circuits of sub-pixels corresponding to the red light-emitting element and the green light-emitting element are connected with the same reset voltage terminal (the third reset voltage terminal INT3), and the first terminal of the first reset sub-circuit of the sub-pixel corresponding to the blue light-emitting element is connected with another reset voltage terminal (the first reset voltage terminal INT1), which is however not taken as a limitation to the present disclosure.

Figure 5A:
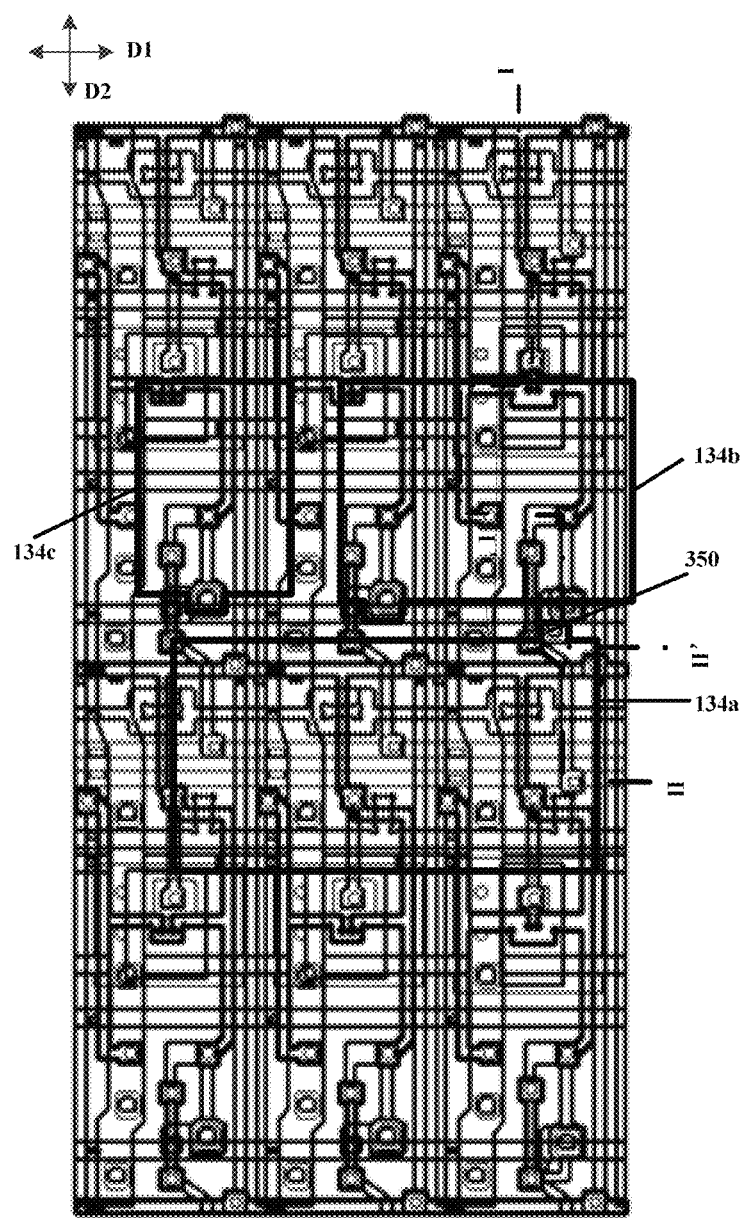
FIG. 5A is a second schematic diagram of a display substrate provided by at least one embodiment of the present disclosure.
Figure 5B:
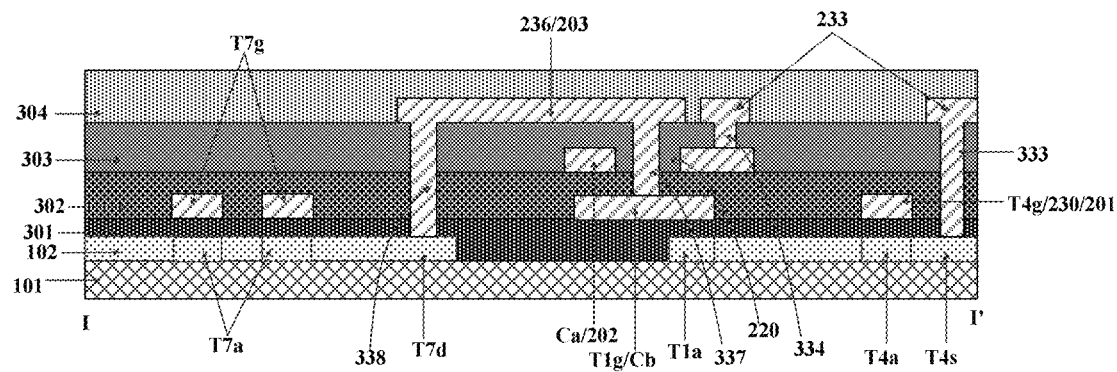
FIG. 5B is a sectional view of FIG. 5A taken along section line I-I'.
Figure 5C:
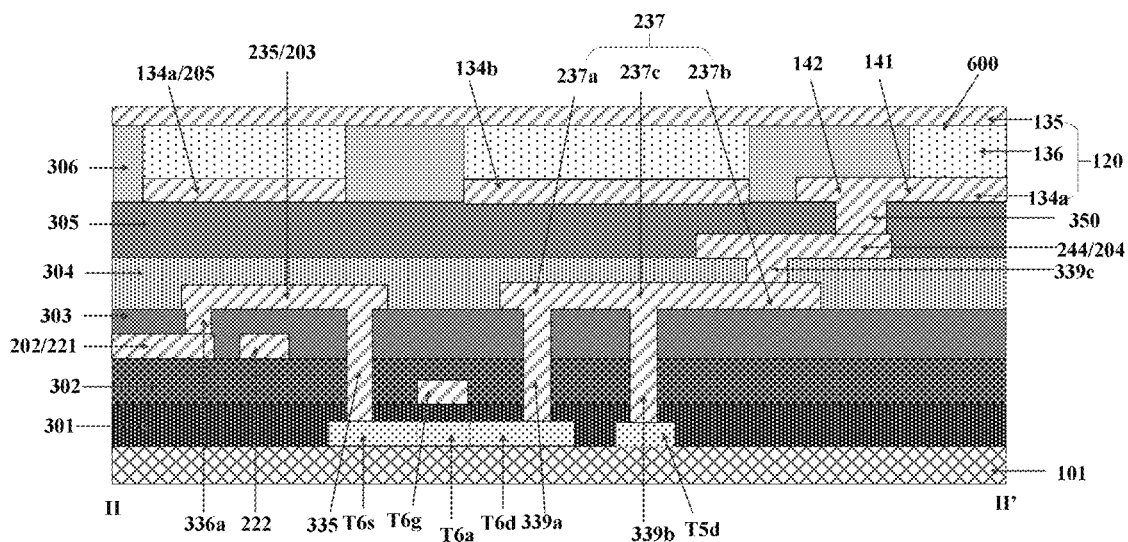
FIG. 5C is a sectional view of FIG. 5A taken along section line II-II'.

FIG. 5A is a schematic diagram of a display substrate 20 provided by at least one embodiment of the present disclosure, FIG. 5B is a sectional view of FIG. 5A along section line I-I', and FIG. 5C is a sectional view of FIG. 5A along section line II-II'. It should be noted that, for the sake of clarity, FIG. 5B and FIG. 5C omit some structures where there is no direct electrical connection relationship at the section line.

As shown in FIG. 5A, the display substrate 20 includes a base substrate 101, and a plurality of sub-pixels 100 are located on the base substrate 101. In some embodiments, the pixel circuits of each sub-pixel may have the same structure and different connection structures with a light-emitting element. That is, pixel circuits are repeatedly arranged in a row direction and a column direction, and the connection structures between different pixel circuits and light-emitting elements can be different according to the arranged shapes and positions of electrodes of light-emitting elements corresponding to each sub-pixel. In some embodiments, the general frame of pixel circuits of sub-pixels with different color, for example, the shape and position of each signal line, are basically the same, and the relative position relationship of each transistor are basically the same. However, the width and shape of some signal lines or connecting lines, or the channel size and shape of some transistors, or the position of connecting lines or via holes configured to connect with light-emitting elements of different sub-pixels can be different, which can be adjusted according to various layout structures and sub-pixel arrangements. In FIG. 5A, three directly adjacent sub-pixels (i.e., the first sub-pixel 100a, the second sub-pixel 100b, and the third sub-pixel 100c) in a row of sub-pixels are exemplarily shown, and embodiments of the present disclosure are not limited to this layout.

Referring to FIG. 5B-FIG. 5C, a semiconductor layer 102, a first insulating layer 301, a first conductive layer 201, a second insulating layer 302, a second conductive layer 202, a third insulating layer 303, a third conductive layer 203, a fourth insulating layer 304, a fourth conductive layer 204, a fifth insulating layer 305, and a fifth conductive layer 205 are sequentially arranged on the base substrate 101, thereby forming the structure of the display substrate shown in FIG. 5A.

Figure 6:
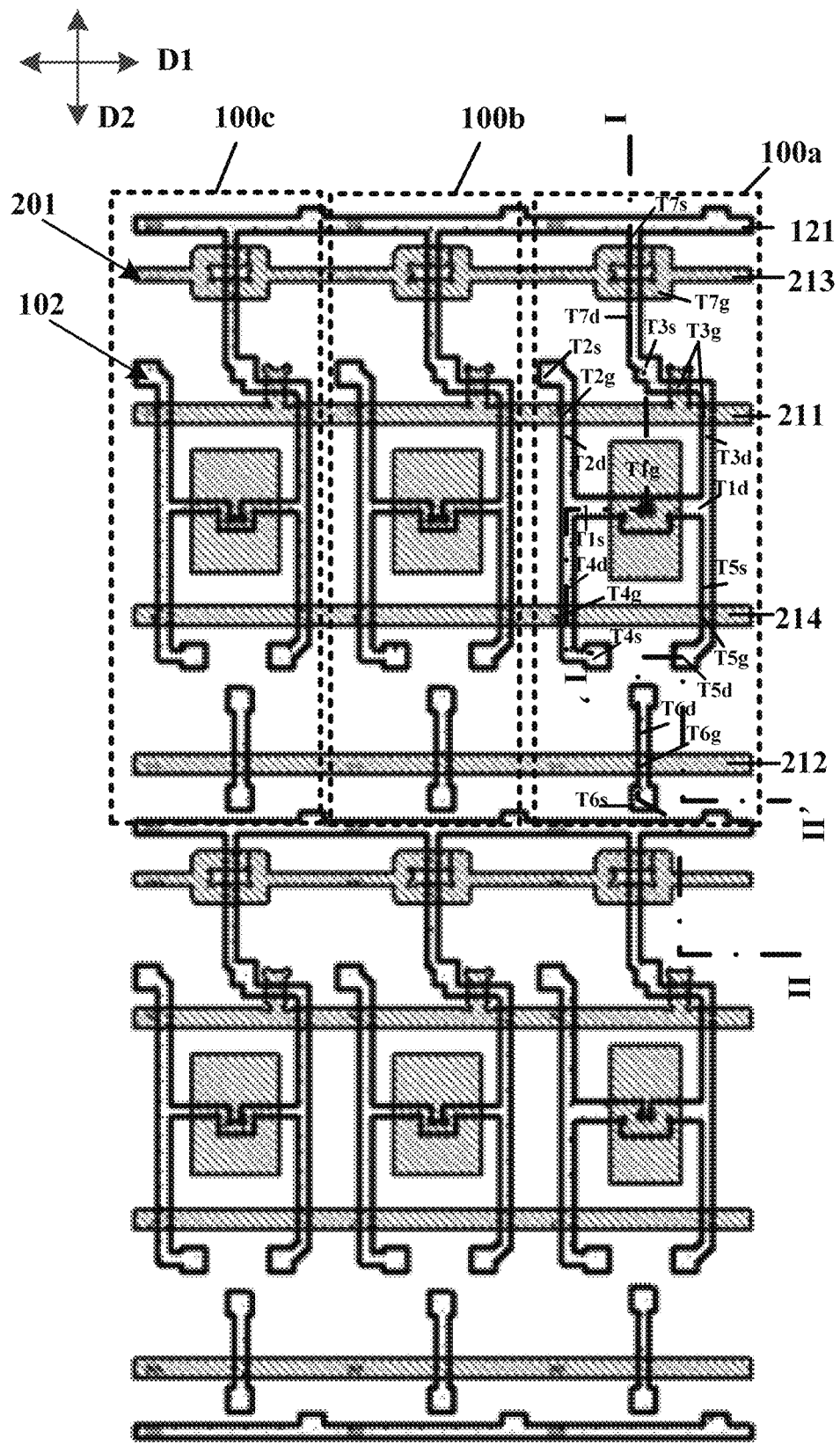
FIG. 6 is a third schematic diagram of a display substrate provided by at least one embodiment of the present disclosure.
Figure 7A:
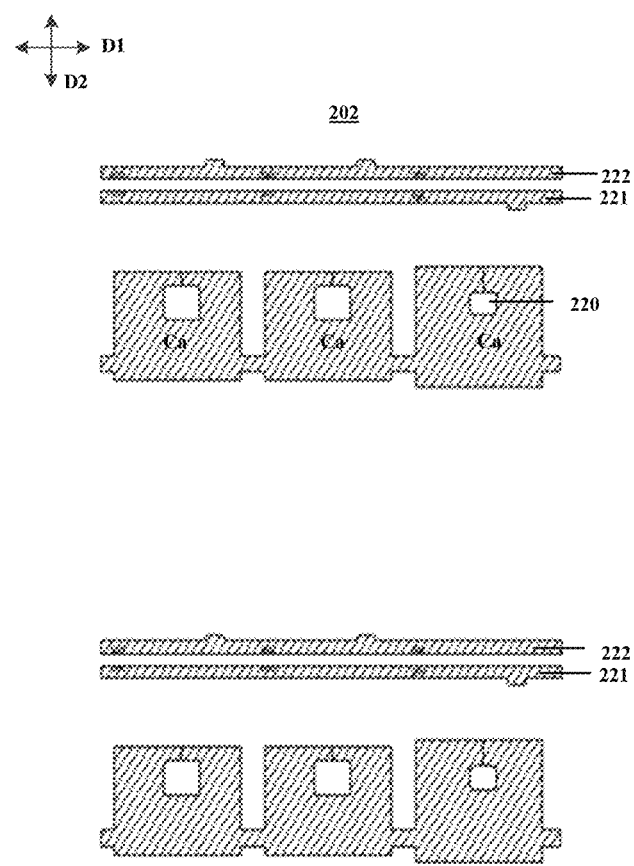
FIG. 7A is a fourth schematic diagram of a display substrate according to at least one embodiment of the present disclosure.
Figure 7B:
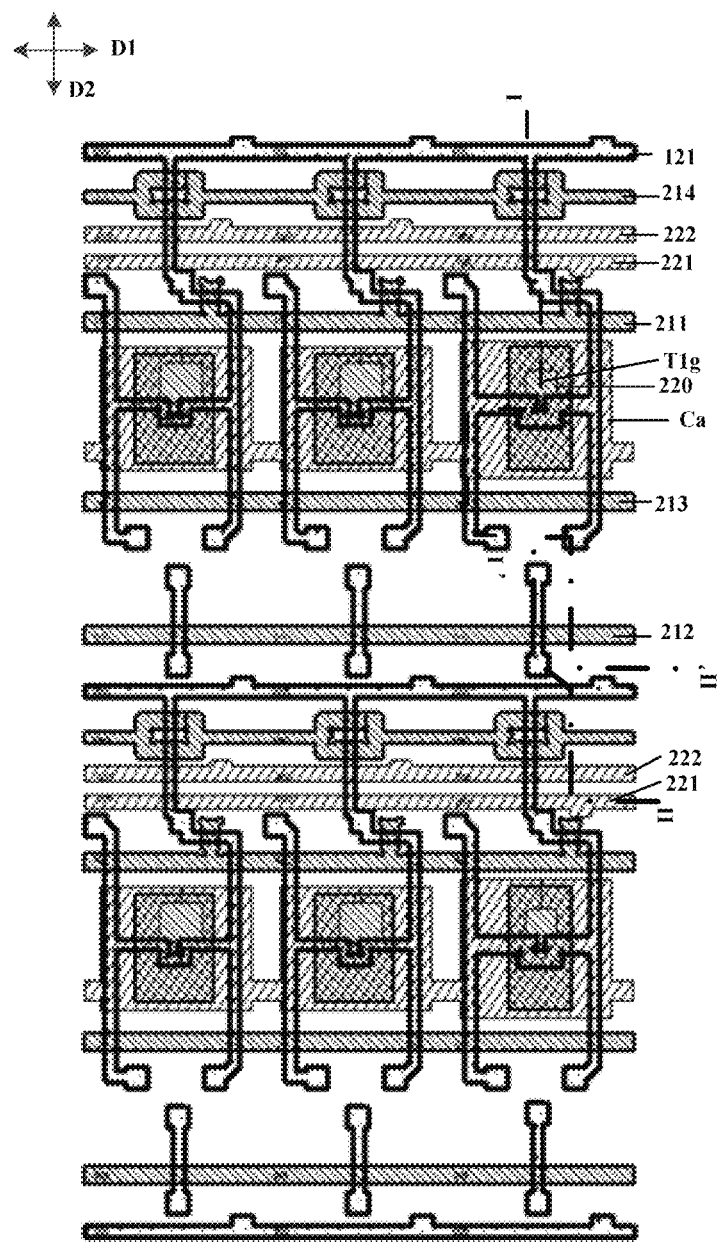
FIG. 7B is a fifth schematic diagram of a display substrate provided by at least one embodiment of the present disclosure.
Figure 8A:
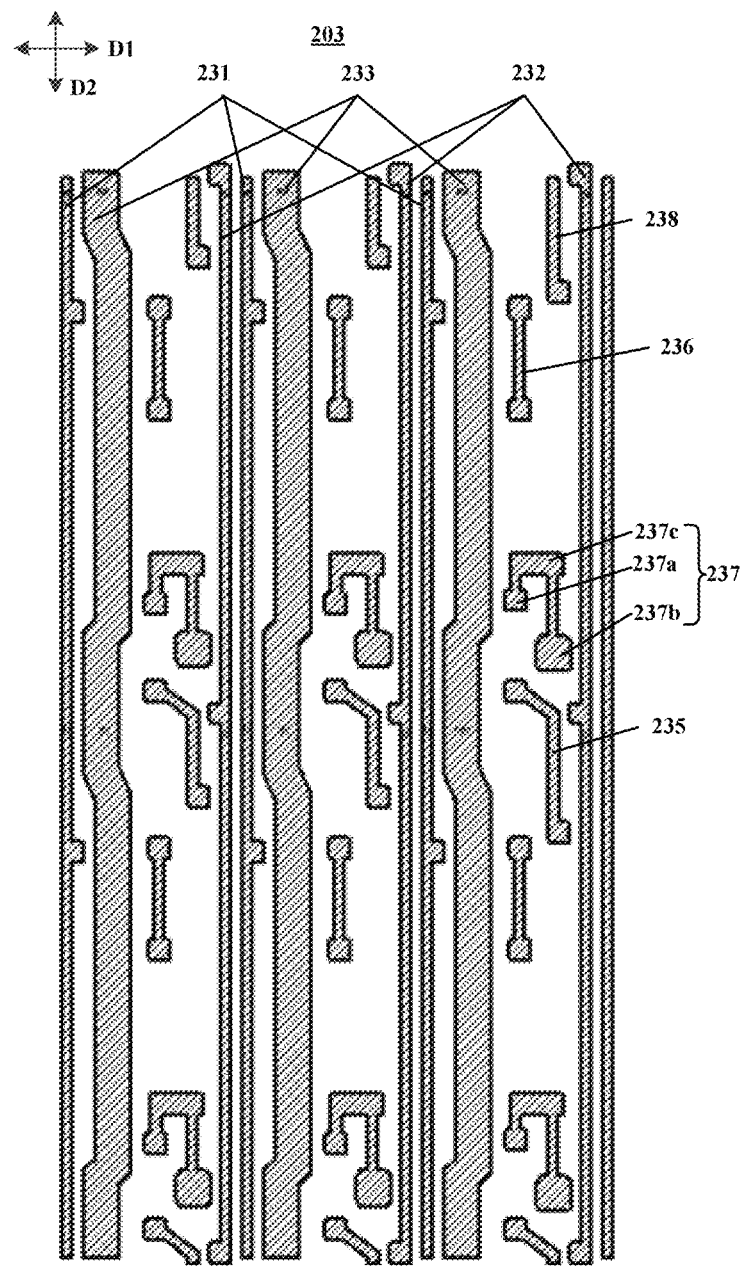
FIG. 8A is a sixth schematic diagram of a display substrate provided by at least one embodiment of the present disclosure.
Figure 8B:
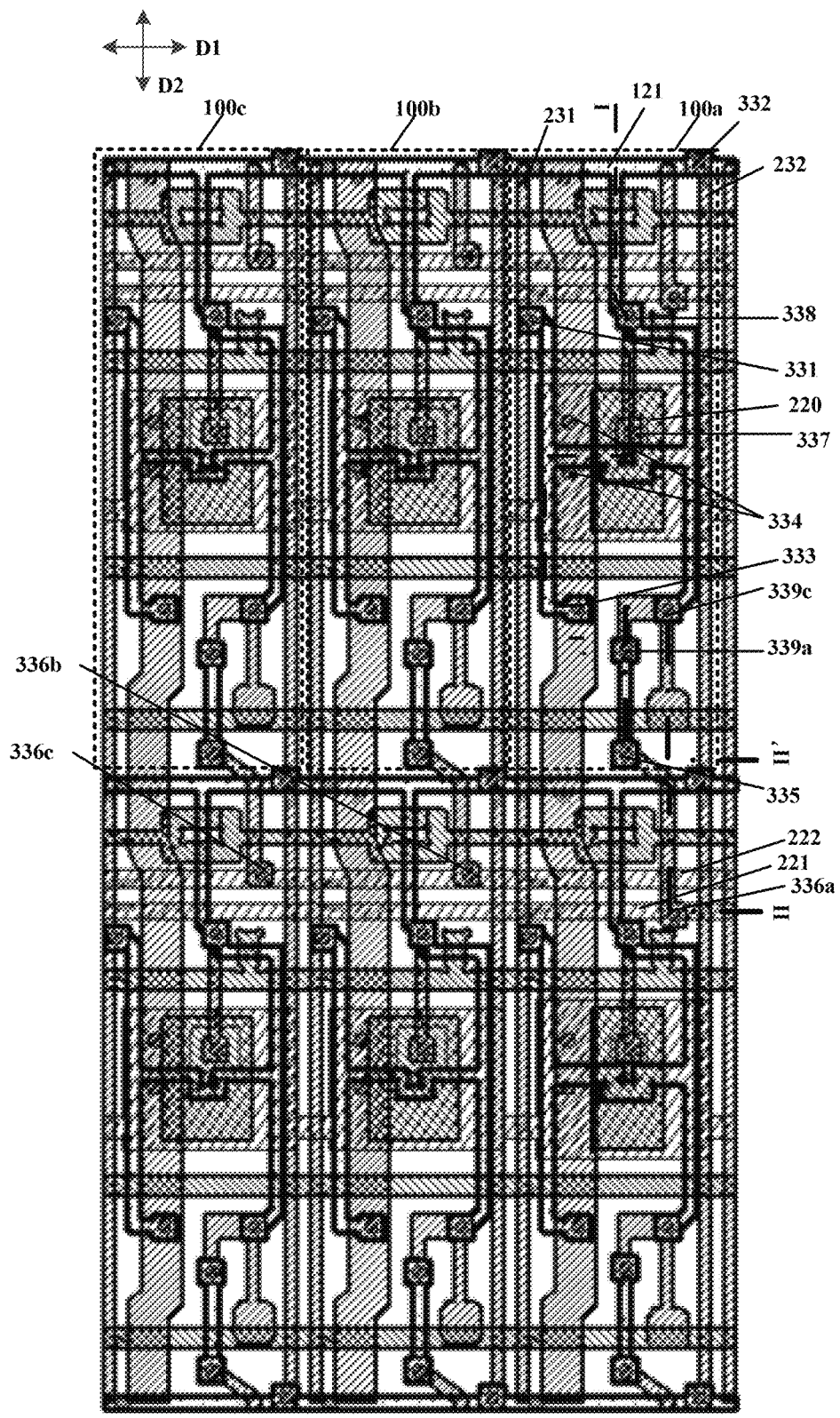
FIG. 8B is a seventh schematic diagram of a display substrate provided by at least one embodiment of the present disclosure.
Figure 9A:
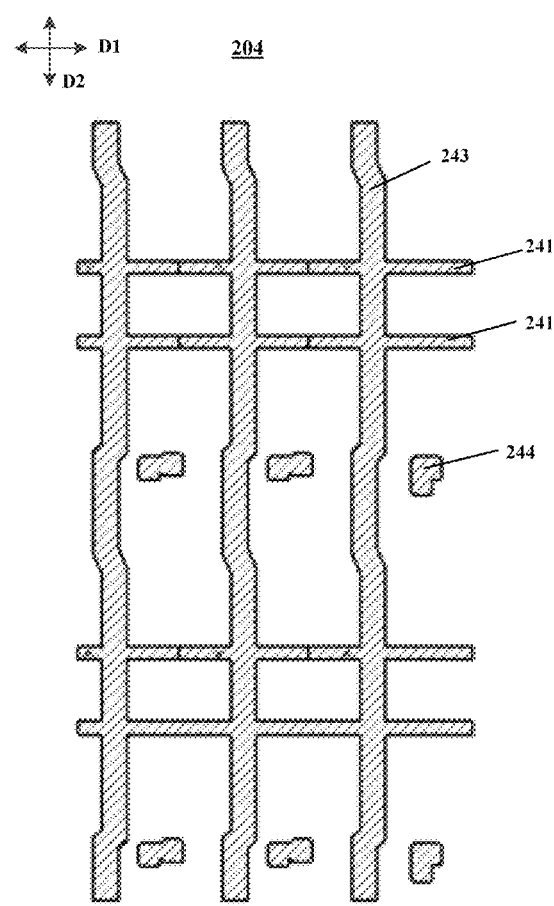
FIG. 9A is a eighth schematic diagram of a display substrate provided by at least one embodiment of the present disclosure.
Figure 9B:
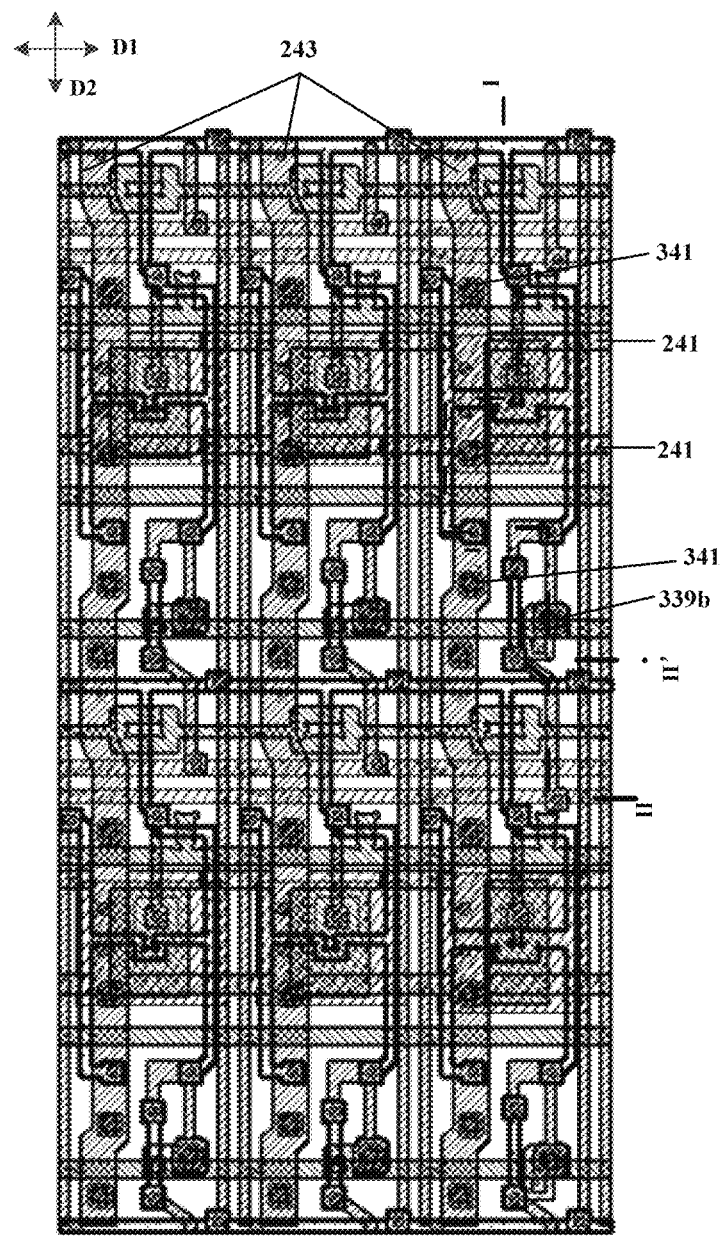
FIG. 9B is a ninth schematic diagram of a display substrate provided by at least one embodiment of the present disclosure.
Figure 10:
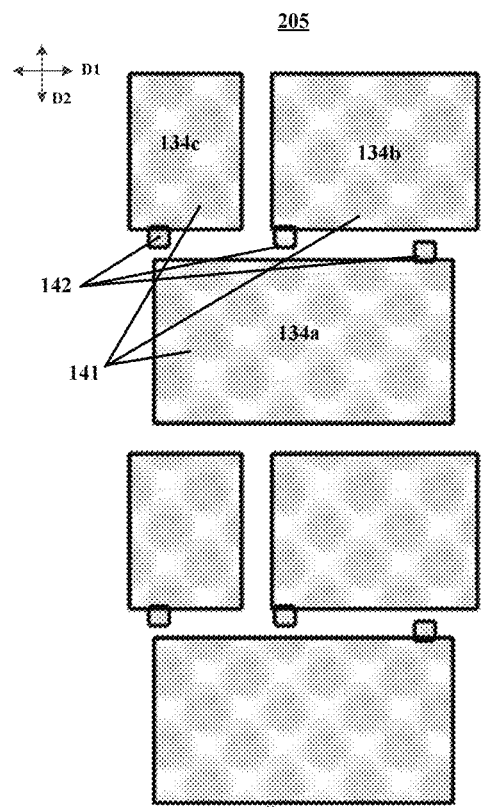
FIG. 10 is a tenth schematic diagram of a display substrate provided by at least one embodiment of the present disclosure.

FIG. 6 schematically shows the semiconductor layer 102 and the first conductive layer 201 of transistors T1-T7 of the three sub-pixels 100 corresponding to FIG. 5A. FIG. 7A shows a schematic diagram of the second conductive layer 202, and FIG. 7B shows the second conductive layer 202 based on FIG. 6. FIG. 8A shows a schematic diagram of the third conductive layer 203, and FIG. 8B shows the third conductive layer 203 based on FIG. 7B. FIG. 9A shows a schematic diagram of the fourth conductive layer 204, and FIG. 9B shows the fourth conductive layer 204 based on FIG. 8B. FIG. 10 shows a schematic diagram of the fifth conductive layer 205. It should be noted that the corresponding structures of three adjacent sub-pixels in a row of sub-pixels are only schematically shown in the figure, but this should not be taken as a limitation of the present disclosure. For the sake of clarity, the section lines I-I' and II-II' in FIG. 3A are shown at corresponding positions in FIG. 6, FIG. 7B, FIG. 8B, and FIG. 9B, respectively.

For convenience of explanation, in the following description, Tng, Tns, Tnd and Tna are respectively used to represent the gate electrode, the first electrode, the second electrode, and the active layer of the nth transistor Tn, where n is 1-7.

It should be noted that "arranged in the same layer" in the present disclosure refers to that two (or more) structures are formed by the same deposition process and patterned by the same patterning process, and their materials can be the same or different. In the present disclosure, "integrated structure" refers to two (or more) structures formed by the same deposition process and patterned by the same patterning process to form a connected structure, and their materials can be the same or different.

As shown in FIG. 6, the semiconductor layer 102 includes active layers T1a-T7a of the first transistor T1 to the seventh transistors T1-T7. The pattern of the semiconductor layer corresponding to each sub-pixel 100 is the same. For example, the first conductive layer 201 includes gate electrodes T1g-T7g of the first transistor T1 to the seventh transistor T7.

For example, as shown in FIG. 6, the display substrate 20 adopts a self-aligned process, and uses the first conductive layer 201 as a mask to perform a conducting treatment on the semiconductor layer 102 (e.g., a doping treatment), so that the portion of the semiconductor layer 102 that is not covered by the first conductive layer 201 is conducted, and the portion of the active layer of each transistor that is shielded by the gate electrode forms the channel region of the transistor, and the portions on both sides of the channel region are conducted to respectively form the first electrode and the second electrode of the transistor.

For example, as shown in FIG. 6, the semiconductor layer 102 further includes a plurality of first reset signal lines 121, the plurality of first reset signal lines are electrically connected with the first terminal of the second reset sub-circuit, that is, the first electrode T7s of the seventh transistor T7, to provide the second reset voltage Vint2. The material of the first reset signal line 250 includes a doped semiconductor material, for example, a doped polysilicon material.

For example, referring to FIG. 1A, the first reset signal line 121, as a conductive line 11, can also be electrically connected with the routing line 132 to be electrically connected with the bonding electrode 131 (i.e., the second reset voltage terminal INT2) located in the bonding region 130.

For example, as shown in FIG. 6, the third transistor T3 and the seventh transistor T7 adopt a double-gate structure, which can improve the gate control capability of the transistors and reduce a leakage current.

For example, the first conductive layer 201 further includes a plurality of gate lines extended along the first direction D1, and the plurality of gate lines are electrically connected with the gate electrodes of the transistors to provide gate control signals. As shown in FIG. 6, the plurality of gate lines include, for example, a plurality of scanning lines 211, a plurality of first reset control lines 212, a plurality of second reset control lines 213, and a plurality of light emission control lines 214. For example, each pixel row is correspondingly connected with a scanning line 211, a first reset control line 212, a second reset control line 213, and a light emission control line 214.

As shown in FIG. 6, the scanning line 211 is electrically connected (or integrated) with the gate electrodes of the second transistors T2 in a corresponding pixel row to provide the first scanning signal Ga1. For example, the scanning line 211 is also electrically connected with the gate electrodes of the third transistors T3 to provide a second scanning signal Ga2, that is, the first scanning signal Ga1 and the second scanning signal Ga2 can be the same signal.

As shown in FIG. 6, the first reset control line 212 is electrically connected with the gate electrodes of the sixth transistors T6 in a corresponding pixel row to provide the first reset control voltage Vrst1. A second reset control line 213 is electrically connected with the gate electrodes of the seventh transistors T7 to provide the second reset control voltage Vrst2.

As shown in FIG. 6, the light emission control line 214 is electrically connected with the gate electrodes of the fourth transistors T4 in a corresponding row of sub-pixels to provide the first light emission control signal EM1. The light emission control line 214 is also electrically connected with the gate electrodes of the fifth transistors T5 to provide the second light emission control signal EM2, that is, the first light emission control signal EM1 and the second light emission control signal EM2 are the same signal.

With reference to FIG. 1A, the scanning line 211, the first reset control line 212, the second reset control line 213, and the light emission control line 214, as some of the conductive lines 11, are also connected with the gate drive circuit 13 to receive the first scanning signal Ga1, the second scanning signal Ga2, the first reset control voltage Vrst1, the second reset control voltage Vrst2, the first light emission control signal EM1, and the second light emission control signal EM2 output by the gate drive circuit 13.

For example, as can be seen from FIG. 6, the conductive line 11 defining the pixel region in the column direction (a second direction D2) can be the first reset signal line 121 or the first reset control line 212.

FIG. 7A shows a schematic diagram of a second conductive layer 202, and FIG. 7B shows the second conductive layer 202 based on FIG. 6.

Referring to FIG. 7A, FIG. 7B and FIG. 5B, the second conductive layer 202 includes a first capacitor electrode Ca. The first capacitor electrode Ca overlaps with the gate electrode T1g of the first transistor T1 in the direction perpendicular to the base substrate 101 to form a storage capacitor Cst, that is, the gate electrode T1g of the first transistor T1 serves as the second capacitor electrode Cb of the storage capacitor Cst. For example, the first capacitor electrode Ca includes an opening 220 that exposes at least a portion of the gate electrode T1g of the first transistor T1, so that the gate electrode T1g can be electrically connected with other structures through the opening 220. For example, the first capacitor electrodes Ca of the sub-pixels located in the same pixel row are connected with each other in an integrated structure.

For example, the second conductive layer 202 may further include a plurality of first reset voltage lines 221 and a plurality of second reset voltage lines 222 extended along the first direction D1; for example, the plurality of first reset voltage lines 221 and the plurality of second reset voltage lines 222 are respectively arranged in one-to-one correspondence with the plurality of pixel rows. The first reset voltage line 221 is electrically connected with the first terminal of the first reset sub-circuit (i.e., the first electrode T6s of the sixth transistor T6) of the first sub-pixel 100a (i.e., the blue sub-pixel) in a corresponding pixel row to provide a first reset voltage Vint1. The second reset voltage line 222 is electrically connected with the first terminal of the first reset sub-circuit (i.e., the first electrode T6s of the sixth transistor T6) of the second sub-pixel 100b (i.e., red sub-pixel) and the first terminal of the first reset sub-circuit (i.e., the first electrode T6s of the sixth transistor T6) of the third sub-pixel 100c (i.e., green sub-pixel) to provide the first reset voltage Vint1 for the second sub-pixel and the third sub-pixel.

FIG. 8A shows a schematic diagram of a third conductive layer 203, and FIG. 8B shows the third conductive layer 203 based on FIG. 7B.

Referring to FIG. 8A and FIG. 8B, the third conductive layer 203 includes a plurality of data lines 231, a plurality of second reset signal lines 232, and a plurality of first power lines 233 extended along the second direction D2. For example, the plurality of data lines 231, the plurality of second reset signal lines 232, and the plurality of first power lines 233 are respectively arranged in one-to-one correspondence with the plurality of pixel columns.

For example, the data line 231 is electrically connected with the first terminal of the data write sub-circuit (i.e., the first electrode T2s of the second transistor) of a corresponding sub-pixel in a pixel column through a via hole 331 to provide a data signal Vd for the sub-pixel. For example, the via hole 331 penetrates through the first insulating layer 301, the second insulating layer 302, and the third insulating layer 303.

For example, the second reset signal line 232 is electrically connected with the first reset signal line 121 through a via hole 332, electrically connecting the plurality of first reset signal lines 121, to form a net structure by interweaving each other horizontally and vertically. This structure helps to reduce the resistance of the signal line, thereby reducing the voltage drop on the signal line, and helping to uniformly supply the second reset voltage Vint2 to each sub-pixel in the display substrate. For example, the via hole 332 penetrates through the first insulating layer 301, the second insulating layer 302, and the third insulating layer 303.

For example, referring to FIG. 1A, the second reset signal line 232 is also electrically connected with the routing line 132, thereby electrically connected with the bonding electrode 131 (i.e., the second reset voltage terminal INT2) in the bonding region 130.

For example, the power line 233 is electrically connected with the first terminal of the first light emission control sub-circuit (i.e., the first electrode T4s of the fourth transistor T4) of the corresponding sub-pixel in a pixel column through the via hole 333 to provide the first power supply voltage VDD. For example, the via hole 333 penetrates through the first insulating layer 301, the second insulating layer 302, and the third insulating layer 303.

For example, as shown in FIG. 8B, the first power line 233 is also electrically connected with the first capacitor electrode Ca of a sub-pixel in a corresponding pixel column through a via hole 334 to provide the first power supply voltage VDD for the first capacitor electrode Ca. For example, the via hole 334 penetrates the third insulating layer 303. For example, the number of the via holes 334 is at least two, so that the first power line 233 and the first capacitor electrode Ca form a structure of parallel connection, which is helpful to reduce contact resistance.

For example, as shown in FIG. 8A and FIG. 8B, the third conductive layer 203 further includes a first connection electrode 235 in each sub-pixel. One terminal of the first connection electrode 235 is electrically connected with the first terminal of the first reset sub-circuit (i.e., the first electrode T6$s$ of the sixth transistor T6) through a via hole 335, and the other terminal of the first connection electrode 235 is electrically connected with the first reset voltage line 221. As shown in FIG. 8B, the first connection electrode 235 located in the first sub-pixel 100$a$ is electrically connected with the first reset voltage line 221 through a via hole 336$a$. The first connection electrodes 235 located in the second sub-pixel 100$b$ and the third sub-pixel 100$c$ are electrically connected with the second reset voltage line 222 through a via hole 336$b$ and a via hole 336$c$, respectively. For example, the via hole 335 penetrates through the first insulating layer 301, the second insulating layer 302, and the third insulating layer 303. The via hole 336$a$, the via hole 336$b$, and the via hole 336$c$ all penetrate through the third insulating layer 303.

With reference to FIG. 1A, the first reset voltage line 221 and the second reset voltage line 222, as some of the conductive line 11, can also be electrically connected with a routing line 132 respectively, so as to be electrically connected with the bonding electrode 131 located in the bonding region 130 that serves as the reset voltage terminal, so that the first reset voltage line 221 and the second reset voltage line 222 are electrically connected with the first reset voltage terminal INT1 and the third reset voltage terminal INT3 respectively.

For example, a plurality of first reset voltage lines 221 are respectively connected with the same routing line 132 and connected with the same first reset voltage terminal INT1, that is, the first sub-pixels in the display substrate are correspondingly electrically connected with the same first reset voltage terminal INT1.

For example, a plurality of second reset voltage lines 222 are connected with the same routing line 132 and connected with the same third reset voltage terminal INT3, that is, the second sub-pixels and the third sub-pixels in the display substrate are correspondingly electrically connected with the same third reset voltage terminal INT3.

For example, as shown in FIG. 8A, FIG. 8B, and FIG. 5B, the third conductive layer 203 further includes a second connection electrode 236 located in each sub-pixel, and one terminal of the second connection electrode 236 is electrically connected with the second capacitor electrode Cb, that is, the gate electrode T1$g$ of the first transistor T1, through the opening 220 in the first capacitor electrode Ca and the via hole 337 penetrating through the second insulating layer 302 and the third insulating layer 303. The other end of the second connection electrode 236 is electrically connected with the first terminal of the compensation sub-circuit (i.e., the first electrode T3$s$ of the third transistor) through a via hole 338 penetrating through the first insulating layer 301, the second insulating layer 302, and the third insulating layer 303, thereby electrically connecting the first electrode T3$s$ of the third transistor with the gate electrode T1$g$ of the first transistor T1 and the second storage capacitor electrode Cb.

With reference to FIG. 5B, by forming an opening 220 in the first capacitor electrode Ca and electrically connecting the second connection electrode 236 with the second capacitor electrode Cb through the opening, a three-dimensional capacitor is formed in the three-dimensional space between the first capacitor electrode Ca and the second connection electrode 236, and the three-dimensional capacitor is connected in parallel with the planar capacitor between the first capacitor electrode Ca and the second capacitor electrode Cb, effectively increasing the capacitance value of the storage capacitor Cst.

For example, as shown in FIG. 8A and FIG. 8B, the third conductive layer 203 further includes a third connection electrode 237 located in each sub-pixel. For example, the third connection electrode 237 includes a first connection terminal 237$a$ and a second connection terminal 237$b$. The first connection terminal 237$a$ is electrically connected with the second terminal of the first reset sub-circuit (i.e., the second electrode T6$d$ of the sixth transistor T6) through a via hole 339$a$, and the second connection terminal 237$b$ is configured to be connected with the first terminal of the light-emitting element through a via hole 339$b$.

For example, as shown in FIG. 8B, the third connection electrode 237 further includes a third connection terminal 237$c$, and the third connection terminal 237$c$ is electrically connected with the second terminal of the first light emission control sub-circuit (i.e., the second electrode T2$d$ of the fifth transistor T5), thereby electrically connecting the second electrode T5$d$ of the fifth transistor t5 with the second electrode T6$d$ of the sixth transistor T6 which is further connected with the light-emitting element.

For example, as shown in FIG. 8A, the third connection electrode 237 has a U-shaped structure, the first connection terminal 237$a$ and the second connection terminal 237$b$ are respectively located at two ends of the U-shaped structure, and the third connection terminal 237$c$ is located at the corner of the U-shaped structure close to the second connection terminal 237$b$. For example, the lengths of two branches of the U-shaped structure are different, that is, the U-shaped structure is asymmetric.

In the embodiments of the present disclosure, the second electrode T2$d$ of the fifth transistor T5 and the second electrode T6$d$ of the sixth transistor T6 are not directly connected in the semiconductor layer 102, but are electrically connected through the third connection electrode 237, which effectively reduces the contact resistance at the fourth node N4 (e.g., the anode node), thereby avoiding the gray scale loss of the pixel electrode (e.g., the anode) of the light-emitting element due to excessive contact resistance, and improving the display quality.

FIG. 9A shows a schematic diagram of a fourth conductive layer 204, and FIG. 9B shows the fourth conductive layer 204 based on FIG. 8B.

Referring to FIG. 9A and FIG. 9B, the fourth conductive layer 204 includes a plurality of power lines 241 extended along the first direction D1 and a plurality of power lines 243 extended along the second direction D2, and the plurality of power lines 241 and the plurality of power lines 243 are crossed with each other and connected into an integrated net structure of power lines.

For example, a plurality of power lines 241 and a plurality of first power lines 233 are arranged in one-to-one correspondence, and each power line 241 and the corresponding first power line 233 overlap with each other in the direction perpendicular to the base substrate 101, and are electrically connected through a via hole 341. For example, the via hole 341 penetrates the fourth insulating layer 304.

For example, each power line 241 is electrically connected with the corresponding first power line 233 through at least two via holes 341 to form a structure of parallel connection, thereby effectively reducing the resistance of the first power line 233, while the net structure of power lines formed by the power lines 241 and 243 further reduces the resistance of the first power line. This structure is helpful to reduce the voltage drop on the first power line and to evenly transmit the first power supply voltage VDD to each sub-pixel of the display substrate, so as to improve the display uniformity of the display substrate.

For example, as shown in FIG. 9A, FIG. 9B, and FIG. 5C, the fourth conductive layer 204 further includes a fourth connection electrode 244 located in each sub-pixel, and the fourth connection electrode 244 is electrically connected with the second connection terminal 237*b* of the third connection electrode 237 through the via hole 339*b*, thereby connecting the second connection terminal 237*b* with the light-emitting element. The via hole 339*b* penetrates through the fourth insulating layer 304.

For example, the routing lines 132 located in the non-display region 103 may be located in the third conductive layer 203, or may include a stacked wiring structure of two layers, and the two layers of wires are respectively located in the third conductive layer 203 and the fourth conductive layer 204.

For example, the bonding electrode 131 located in the non-display region 103 (for example, the first reset voltage terminal INT1, the second reset voltage terminal INT2, and the third reset voltage terminal INT3) may include a two-layer stacked electrode structure. The two layers of electrode structures are overlapped with each other and directly contacted with each other. The two layers of electrodes can be located in the third conductive layer 203 and the fourth conductive layer 204, respectively. In other examples, the bonding electrode 131 may also include a three-layer stacked electrode structure. The three layers of electrode structures are overlapped with each other and directly contacted with each other. The three layers of electrode structures can be located in the first conductive layer 201, the third conductive layer 203, and the fourth conductive layer 204, respectively.

FIG. 10 shows a schematic diagram of the fifth conductive layer 205. As shown in FIG. 10, 5A and FIG. 5C, the fifth conductive layer 205 includes first electrodes 134 of each light-emitting element, and include a first electrode 134*a* connected with the pixel circuit of the first sub-pixel 100*a*, a first electrode 134*b* connected with the pixel circuit of the second sub-pixel 100*b*, and a first electrode 134*c* connected with the pixel circuit of the third sub-pixel 100*c*. Each first electrode is electrically connected with the fourth connection electrode 244 of the corresponding pixel circuit through a via hole 350, so as to be connected with the second electrode T5*d* of the fifth transistor T5 and the second electrode T6*d* of the sixth transistor T6 through the third connection electrode 237. The via hole 350 penetrates through the fifth insulating layer 305.

Referring to FIG. 10, FIG. 5A, and FIG. 5C, the first electrode 134 includes a main body portion 141 and a connection portion 142. The main body portion 141 is mainly configured to drive the light-emitting layer to emit light. The connection portion 142 is mainly configured to be connected with the corresponding pixel circuit. For example, the main body portion 141 is rectangular, and the connection portion 142 protrudes from the main body portion 141 and is electrically connected with the fourth connection electrode 244 of the corresponding pixel circuit through the via hole 350. For example, the first electrode 134*b* and the first electrode 134*c* respectively connected with the second sub-pixel 100*b* and the third sub-pixel 100*c* are arranged side by side along the first direction, and the first electrode 134*b*, the first electrode 134*c*, and the first electrodes 134*a* that is connected with the first sub-pixel 100*a* are arranged in a triangle. For example, the areas of the first electrode 134*a*, the first electrode 134*b*, and the first electrode 134*c* decrease in sequence.

For example, as shown in FIG. 5C, the display substrate 20 may further include a pixel defining layer 306 on the first electrode of the light-emitting element. An opening is formed in that pixel define layer 306, to expose at least a portion of the main body portion 141 of the first electrode 134 so as to define an opening region (i. e., an effective light-emitting region) 600 of the display substrate. The light-emitting layer 136 of the light-emitting element 120 is formed at least in the opening (the light-emitting layer 136 may also cover a portion of the pixel defining layer), and the second electrode 135 is formed on the light-emitting layer 136 to form the light-emitting element 120. For example, the second electrode 135 is a common electrode, and is arranged on the whole surface in the display substrate 20. For example, the first electrode 134 is the anode of the light-emitting element, and the second electrode 135 is the cathode of the light-emitting element.

For example, the orthographic projection of the main body portion 141 of the first electrode on the base substrate 101 covers the orthographic projection of the opening region 600 of the sub-pixel to which the first electrode belongs, and the orthographic projection of the connection portion 142 on the base substrate 101 covers the orthographic projection of the via hole 350 on the base substrate, that is, the main body portion 141 of the first electrode does not overlap with the via hole 350 in the direction perpendicular to the base substrate, so as to prevent the via hole 350 from affecting the light-emitting quality by affecting the flatness of the light-emitting layer in the opening region.

For example, the via hole 339*c* and the via hole 350 do not overlap in the direction perpendicular to the base substrate 101, so as to void poor connection, disconnection or unevenness at the position of the via hole caused by via holes overlapping in the direction perpendicular to the substrate.

For example, the shapes and sizes of a plurality of opening regions corresponding to the sub-pixels 100 can be changed according to the luminous efficiency, service life, etc., of luminescent materials emitting light of different colors. For example, the corresponding opening region of the luminescent material with a shorter luminescent life can be set larger so as to improve the stability of luminescence. For example, the sizes of opening regions of a blue sub-pixel, a red sub-pixel, and a green sub-pixel can be reduced sequentially. Because the opening region is arranged on the first electrode 134, accordingly, as shown in FIG. 10, the areas of the first electrode 134*a*, the first electrode 134*b*, and the first electrode 134*c* of the first sub-pixel 100*a*, the second sub-pixel 100*b*, and the third sub-pixel 100*c* decrease sequentially.

For example, the base substrate 101 may be a rigid substrate, such as a glass substrate, a silicon substrate, etc., or may be formed of a flexible material having excellent heat resistance and durability. For example, polyimide (PI), polycarbonate (PC), polyethylene terephthalate (PET), polyethylene, polyacrylate, polyaryl compounds, polyether imide, polyether sulfone, polyethylene terephthalate (PET), polyethylene (PE), polypropylene (PP), polysulfone (PSF), polymethylmethacrylate (PMMA), cellulose triacetate (TAC), cycloolefin polymer (COP) and cycloolefin copolymer (COC), etc.

For example, the material of the semiconductor layer 102 includes but is not limited to silicon-based materials (amorphous silicon a-Si, polysilicon p-Si, etc.), metal oxide semiconductors (IGZO, ZnO, AZO, IZTO, etc.), and organic materials (hexathiophene, polythiophene, etc.).

For example, the materials of the first conductive layer to the fourth conductive layer may include gold (Au), silver (Ag), copper (Cu), aluminum (Al), molybdenum (Mo), magnesium (Mg), tungsten (W), and alloy materials formed by combining the above metals, or include conductive metal oxide materials, such as indium tin oxide (ITO), indium zinc oxide (IZO), zinc oxide (ZnO), zinc aluminum oxide (AZO), etc.

For example, the light-emitting element 120 has a top emission structure, and the first electrode 134 (i.e., the fifth conductive layer 205) is reflective while the second electrode 135 is transmissive or semi-transmissive. For example, the material of the first electrode 134 has a high work function to serve as an anode, for example, the first electrode 134 has an ITO/Ag/ITO laminated structure. The material of the second electrode 135 has a low work function to serve as a cathode, for example, the second electrode 135 has a semi-transmissive metal or metal alloy material, for example, an Ag/Mg alloy material.

For example, the first insulating layer 301, the second insulating layer 302, and the third insulating layer 303 include an inorganic insulating layer, such as silicon oxide, silicon nitride, silicon oxynitride, or silicon nitride or silicon oxynitride, or aluminum oxide, titanium nitride, or other insulating materials including metal oxynitride. For example, the fourth insulating layer 304, the fifth insulating layer 305 and the pixel defining layer 306 include organic insulating materials, such as polyimide (PI), acrylate, epoxy resin, polymethylmethacrylate (PMMA), etc. For example, the fourth insulating layer 304 and the fifth insulating layer 305 are planarization layers. In other examples, the fourth insulating layer 304 may also include a laminated structure of an inorganic insulating layer and an organic insulating layer, the inorganic insulating layer is a passivation layer, the organic insulating layer is a planarization layer, and the organic insulating layer is further away from the base substrate 101 than the inorganic insulating layer.

At least one embodiment of the present disclosure also provides a display panel including any one of the above display substrates 20. It should be noted that the display substrate 20 provided in at least one embodiment of the present disclosure may or may not include the light-emitting element 120, that is, the light-emitting element 120 may be formed in a panel factory after the display substrate 20 is completed. In the case where the display substrate 20 itself does not include the light-emitting element 120, the display panel provided by the embodiments of the present disclosure further includes the light-emitting element 120 in addition to the display substrate 20.

Figure 11:
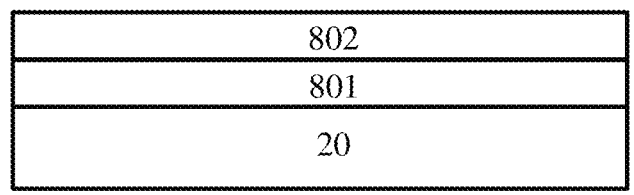
FIG. 11 is a schematic diagram of a display panel according to at least one embodiment of the present disclosure.

For example, the display panel is an OLED display panel, and accordingly the display substrate 20 included in the display panel is an OLED display substrate. As shown in FIG. 11, for example, the display panel 30 further includes an encapsulation layer 801 and a cover plate 802 arranged on the display substrate 20. The encapsulation layer 801 is configured to seal the light-emitting elements on the display substrate 20 to prevent external moisture and oxygen from penetrating into the light-emitting elements and the drive sub-circuits to cause damage to the devices. For example, the encapsulation layer 801 includes an organic thin film or a structure in which organic thin films and inorganic thin films are alternately stacked. For example, a water absorbing layer (not shown) may also be arranged between the encapsulation layer 801 and the display substrate 20, and is configured to absorb residual water vapor or sol in the previous manufacturing process of the light-emitting element. The cover plate 802 is, for example, a glass cover plate. For example, the cover plate 802 and the encapsulation layer 801 may have an integral structure.

Figure 12:
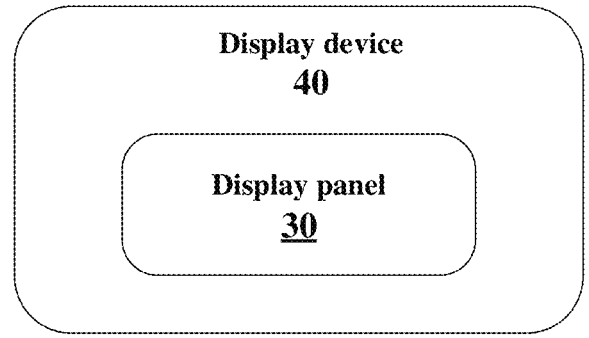
FIG. 12 is a schematic diagram of a display device according to at least one embodiment of the present disclosure.

At least one embodiment of the present disclosure also provides a display device 40. As shown in FIG. 12, the display device 40 includes any one of the above-mentioned display substrates 20 or display panels 30. The display device in this embodiment can be any product or component with display function, such as a display, OLED panel, OLED television, electronic paper, mobile phone, tablet computer, notebook computer, digital photo frame, navigator, vehicle-mounted display screen, etc.

The embodiments of the present disclosure also provide a drive method which can be used to drive the display substrate 20 provided by the embodiments of the present disclosure.

For example, in the example shown in FIG. 3A-FIG. 3B, the drive method includes a reset stage and a light-emitting stage. The reset stage includes: inputting a first reset control voltage and a first reset voltage Vint1 to turn on a first reset sub-circuit, and applying the first reset voltage Vint1 to the light-emitting element to reversely bias the light-emitting element. The light-emitting stage includes: turning on the drive circuit to apply the drive current to the light-emitting element to make the light-emitting element emit light.

For example, the drive method may further include a data write and compensation stage, and the data write and compensation stage includes: inputting a first scanning signal, a second scanning signal, and a data signal to turn on a data write sub-circuit, a drive circuit, and a compensation sub-circuit, so that the data signal is written into the drive sub-circuit, the compensation sub-circuit stores the data signal, and the compensation circuit compensates the drive sub-circuit.

For example, the drive method may further include a reset voltage holding stage. The reset voltage holding stage includes: inputting a first light emission control signal EM1 and a second light emission control signal EM2 to turn off the first reset control circuit and the second reset control circuit to hold the first reset voltage Vint1 on the first electrode of the OLED. By providing the reset voltage holding stage, the holding time of the first reset voltage Vint1 can be adjusted, that is, the time duration that the light-emitting element is in the reverse bias state can be adjusted.

For a detailed description of the drive method, reference can be made to the foregoing description of the embodiments as shown in FIG. 3A-FIG. 3B, and the details are not repeated here.

The above are merely specific implementations of the present disclosure without limiting the protection scope of the present disclosure thereto. The protection scope of the present disclosure should be based on the protection scope of the appended claims.

What is claimed is:

1. A display substrate, comprising:
   a base substrate; and
   a plurality of sub-pixels, located on the base substrate and arranged in an array,
   wherein each of the plurality of sub-pixels comprises a pixel circuit, and the pixel circuit is configured to drive a light-emitting element corresponding to the each of the plurality of sub-pixels to emit light;
   each of the plurality of pixel circuits comprises a drive sub-circuit, a data write sub-circuit, a compensation sub-circuit, a storage sub-circuit, and a first reset sub-circuit;
   the drive sub-circuit comprises a control terminal, a first terminal, and a second terminal, and the drive sub-circuit is configured to be connected with the light-emitting element and control a drive current flowing through the light-emitting element;
   the data write sub-circuit is connected with the first terminal of the drive sub-circuit and is configured to write a data signal into the first terminal of the drive sub-circuit in response to a first scanning signal;
   the compensation sub-circuit comprises a control terminal, a first terminal and a second terminal, and the control terminal of the compensation sub-circuit is configured to receive a second scanning signal, the first terminal and the second terminal of the compensation sub-circuit are respectively electrically connected with the control terminal and the second terminal of the drive sub-circuit, and the compensation sub-circuit is configured to compensate a threshold value of the drive sub-circuit in response to the second scanning signal;
   the storage sub-circuit comprises a first terminal and a second terminal, the first terminal of the storage sub-circuit is configured to receive a first power supply voltage, and the second terminal of the storage sub-circuit is electrically connected with the control terminal of the drive sub-circuit;
   the first reset sub-circuit comprises a control terminal, a first terminal, and a second terminal, the control terminal of the first reset sub-circuit is configured to receive a first reset control voltage, the first terminal of the first reset sub-circuit is configured to receive a first reset voltage, and the second terminal of the first reset sub-circuit is configured to be connected with the light-emitting element;
   the first reset sub-circuit is configured to apply the first reset voltage to the light-emitting element to reversely bias the light-emitting element in response to the first reset control voltage; and
   the plurality of sub-pixels comprise a first sub-pixel, the display substrate further comprises a first reset voltage terminal, and the first reset voltage terminal is configured to be connected with a first terminal of the first reset sub-circuit of the first sub-pixel to provide the first reset voltage to the first sub-pixel;
   the plurality of sub-pixels are arranged in a plurality of pixel rows along a first direction and a plurality of pixel columns along a second direction, and the display substrate further comprises a first reset voltage line extended along the first direction, and the first reset voltage line is electrically connected with the first reset voltage terminal and the first terminal of the first reset sub-circuit respectively to provide the first reset voltage for the plurality of sub-pixels;
   the plurality of sub-pixels further comprises a second sub-pixel, and the first sub-pixel and the second sub-pixel correspond to light-emitting elements emitting different colors;
   the display substrate further comprises a second reset voltage terminal, and the second reset voltage terminal is configured to be connected with the first terminal of the first reset sub-circuit of the second sub-pixel to provide the first reset voltage to the second sub-pixel; and
   the first reset voltage output by the first reset voltage terminal is different from the first reset voltage output by the second reset voltage terminal.

2. The display substrate according to claim 1, wherein each of the plurality of pixel circuits further comprises a second reset sub-circuit, and
   the second reset sub-circuit is connected with the control terminal of the drive sub-circuit and is configured to apply a second reset voltage to the control terminal of the drive sub-circuit in response to a second reset control voltage, to reset the control terminal of the drive sub-circuit.

3. The display substrate according to claim 2, further comprising a third reset voltage terminal,
   wherein the third reset voltage terminal is configured to be connected with the second reset sub-circuit to provide the second reset voltage, and
   the second reset voltage output by the third reset voltage terminal is greater than the first reset voltage output by the first reset voltage terminal.

4. The display substrate according to claim 1, further comprising a first reset signal line extended along the first direction, wherein
   the first reset signal line is connected with the control terminal of the second reset sub-circuit to provide the second reset voltage, and
   the first reset signal line is at a side of the first reset voltage line close to the base substrate, and the first reset signal line comprises a doped semiconductor material.

5. The display substrate according to claim 4, further comprising a second reset signal line extended along the second direction,
   wherein the second reset signal line is at a side of the first reset voltage line away from the base substrate and is electrically connected with the first reset signal line.

6. The display substrate according to claim 1, wherein each of the plurality of pixel circuits further comprises a first connection electrode;
   the first connection electrode is at a side of the first reset voltage line away from the base substrate, and is respectively electrically connected with the first terminal of the first reset sub-circuit and the first reset voltage line.

7. The display substrate according to claim 6, wherein the storage sub-circuit comprises a storage capacitor, and the storage capacitor comprises a first capacitor electrode and a second capacitor electrode;
   the first capacitor electrode and the first reset voltage line are in a same layer and insulated from each other, and the second capacitor electrode is at a side of the first capacitor electrode close to the base substrate.

8. The display substrate according to claim 7, wherein each of the plurality of pixel circuits further comprises a second connection electrode;
   the second connection electrode and the first connection electrode are in a same layer and insulated from each other, and the second connection electrode is respectively electrically connected with the second capacitor electrode and the first terminal of the compensation sub-circuit.

9. The display substrate according to claim 8, wherein the first capacitor electrode comprises an opening, and the second connection electrode is insulated from the first capacitor electrode and is electrically connected with the second capacitor electrode through the opening.

10. The display substrate according to claim 6, wherein each of the plurality of pixel circuits further comprises a third connection electrode;
the third connection electrode and the first connection electrode are in a same layer and insulated from each other, the third connection electrode comprises a first connection terminal and a second connection terminal, the first connection terminal is electrically connected with the second terminal of the first reset sub-circuit, and the second connection terminal is configured to be connected with the light-emitting element.

11. The display substrate according to claim 10, wherein each of the plurality of pixel circuits further comprises a light emission control sub-circuit;
the light emission control sub-circuit comprises a control terminal, a first terminal, and a second terminal, the first terminal of the light emission control sub-circuit is connected with the second terminal of the drive sub-circuit, and the second terminal of the light emission control sub-circuit is configured to be connected with the light-emitting element.

12. The display substrate according to claim 11, wherein the third connection electrode further comprises a third connection terminal, and the third connection terminal is electrically connected with the second terminal of the light emission control sub-circuit, thereby connecting the second terminal of the light emission control sub-circuit with the light-emitting element.

13. The display substrate according to claim 12, wherein the third connection electrode is in a U-shaped structure; and
the first connection terminal and the second connection terminal are respectively at two end points of the U-shaped structure, and the third connection terminal is at a corner of the U-shaped structure close to the second connection terminal.

14. The display substrate according to claim 1, wherein the first reset voltage output by the first reset voltage terminal is lower than the first reset voltage output by the second reset voltage terminal.

15. The display substrate according to claim 1, wherein the plurality of sub-pixels further comprise a third sub-pixel;
the first sub-pixel, the second sub-pixel, and the third sub-pixel respectively correspond to a blue light-emitting element, a red light-emitting element, and a green light-emitting element; and
the second reset voltage terminal is further connected with the first terminal of the first reset sub-circuit of the third sub-pixel to provide the first reset voltage to the third sub-pixel.

16. The display substrate according to claim 15, further comprising a second reset voltage line extended along the first direction,
wherein the first sub-pixel, the second sub-pixel, and the third sub-pixel are in a same pixel row;
the first reset voltage line electrically connects the first terminal of the first reset sub-circuit of the first sub-pixel with the first reset voltage terminal, and the second reset voltage line electrically connects the first terminal of the first reset sub-circuit of the second sub-pixel with the second reset voltage terminal.

17. A drive method for the display substrate according to claim 1, comprising a reset stage and a light-emitting stage,
wherein the reset stage comprises:
inputting the first reset control voltage and the first reset voltage to turn on the first reset sub-circuit, and
applying the first reset voltage to the light-emitting element to reversely bias the light-emitting element;
the light-emitting stage comprises:
turning on the drive sub-circuit and applying the drive current to the light-emitting element to enable the light-emitting element to emit light.

18. A display device, comprising:
the display substrate according to claim 1, and
a plurality of light-emitting elements,
wherein the plurality of light-emitting elements correspond to the plurality of sub-pixels in a one-to-one correspondence, each of the plurality of light-emitting elements comprises a first electrode and a second electrode, and the first electrode of each of the plurality of light-emitting elements is connected with the second terminal of the first reset sub-circuit of a corresponding sub-pixel.

* * * * *